(12) United States Patent
Srinivasan et al.

(10) Patent No.: US 9,577,186 B2
(45) Date of Patent: Feb. 21, 2017

(54) NON-VOLATILE RESISTIVE OXIDE MEMORY CELLS AND METHODS OF FORMING NON-VOLATILE RESISTIVE OXIDE MEMORY CELLS

(75) Inventors: Bhaskar Srinivasan, Boise, ID (US); Gurtej Sandhu, Boise, ID (US); John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1185 days.

(21) Appl. No.: 13/488,190

(22) Filed: Jun. 4, 2012

(65) Prior Publication Data

US 2012/0241714 A1    Sep. 27, 2012

Related U.S. Application Data

(62) Division of application No. 12/114,096, filed on May 2, 2008, now Pat. No. 8,211,743.

(51) Int. Cl.
*H01L 21/00* (2006.01)
*H01L 45/00* (2006.01)
*H01L 27/24* (2006.01)

(52) U.S. Cl.
CPC .......... *H01L 45/04* (2013.01); *H01L 27/2463* (2013.01); *H01L 27/2472* (2013.01);
(Continued)

(58) Field of Classification Search
None
See application file for complete search history.

(56) References Cited

U.S. PATENT DOCUMENTS 4,715,685 A   12/1987 Yaniv et al.
4,964,080 A   10/1990 Tzeng
(Continued)

FOREIGN PATENT DOCUMENTS

CN   1339159   3/2002
CN   1444284   9/2003
(Continued)

OTHER PUBLICATIONS

U.S. Appl. No. 12/099,267, filed Apr. 8, 2008, Smythe et al.
(Continued)

*Primary Examiner* — Jack Chen
(74) *Attorney, Agent, or Firm* — Wells St. John, P.S.

(57) ABSTRACT

A method of forming a non-volatile resistive oxide memory cell includes forming a first conductive electrode of the memory cell as part of a substrate. The first conductive electrode has an elevationally outermost surface and opposing laterally outermost edges at the elevationally outermost surface in one planar cross section. Multi-resistive state metal oxide-comprising material is formed over the first conductive electrode. Conductive material is deposited over the multi-resistive state metal oxide-comprising material. A second conductive electrode of the memory cell which comprises the conductive material is received over the multi-resistive state metal oxide-comprising material. The forming thereof includes etching through the conductive material to form opposing laterally outermost conductive edges of said conductive material in the one planar cross section at the conclusion of said etching which are received laterally outward of the opposing laterally outermost edges of the first conductive electrode in the one planar cross section.

14 Claims, 12 Drawing Sheets

(52) U.S. Cl.
CPC ........ *H01L 45/1233* (2013.01); *H01L 45/146*
(2013.01); *H01L 45/147* (2013.01); *H01L*
*45/1675* (2013.01)

(56) References Cited

U.S. PATENT DOCUMENTS

| | | |
|---|---|---|
| 5,049,970 A | 9/1991 | Tanaka et al. |
| 5,122,476 A | 6/1992 | Fazan et al. |
| 6,034,882 A | 3/2000 | Johnson et al. |
| 6,218,696 B1 | 4/2001 | Radius |
| 6,432,767 B2 | 8/2002 | Torli et al. |
| 6,524,867 B2 | 2/2003 | Yang et al. |
| 6,552,952 B2 | 4/2003 | Pascucci |
| 6,687,147 B2 | 2/2004 | Frickie et al. |
| 6,693,821 B2 | 2/2004 | Hsu et al. |
| 6,693,846 B2 | 2/2004 | Fibranz |
| 6,717,881 B2 | 4/2004 | Oishi |
| 6,753,561 B1 | 6/2004 | Rinerson et al. |
| 6,753,562 B1 | 6/2004 | Hsu et al. |
| 6,757,188 B2 | 6/2004 | Perner et al. |
| 6,778,421 B2 | 8/2004 | Tran |
| 6,785,159 B2 | 8/2004 | Tuttle |
| 6,806,531 B1 | 10/2004 | Chen et al. |
| 6,834,008 B2 | 12/2004 | Rinerson et al. |
| 6,873,544 B2 | 3/2005 | Perner |
| 6,905,937 B2 | 6/2005 | Hsu et al. |
| 6,930,324 B2 | 8/2005 | Kowalski et al. |
| 6,940,113 B2 | 9/2005 | Hsu et al. |
| 6,946,702 B2 | 9/2005 | Jang |
| 6,950,369 B2 | 9/2005 | Kunikiyo et al. |
| 6,955,992 B2 | 10/2005 | Zhang et al. |
| 6,958,273 B2 | 10/2005 | Chen et al. |
| 6,961,258 B2 | 11/2005 | Lowrey |
| 6,970,375 B2 | 11/2005 | Rinerson et al. |
| 6,972,211 B2 | 12/2005 | Hsu et al. |
| 6,985,374 B2 | 1/2006 | Yamamura |
| 7,002,197 B2 | 2/2006 | Perner et al. |
| 7,005,350 B2 | 2/2006 | Walker et al. |
| 7,009,278 B2 | 3/2006 | Hsu |
| 7,026,911 B2 | 4/2006 | Aono et al. |
| 7,029,924 B2 | 4/2006 | Hsu et al. |
| 7,029,925 B2 | 4/2006 | Celii et al. |
| 7,035,141 B1 | 4/2006 | Tripsas et al. |
| 7,046,550 B1 | 5/2006 | Reohr et al. |
| 7,050,316 B1 | 5/2006 | Lin et al. |
| 7,067,862 B2 | 6/2006 | Rinerson et al. |
| 7,085,167 B2 | 8/2006 | Lee et al. |
| 7,109,544 B2 | 9/2006 | Schoelesser et al. |
| 7,123,535 B2 | 10/2006 | Kurotsuchi et al. |
| 7,149,108 B2 | 12/2006 | Rinerson et al. |
| 7,167,387 B2 | 1/2007 | Sugita et al. |
| 7,180,160 B2 | 2/2007 | Ferrant et al. |
| 7,187,201 B1 | 3/2007 | Trimberger |
| 7,193,267 B2 | 3/2007 | Hsu et al. |
| 7,205,238 B2 | 4/2007 | Pan et al. |
| 7,233,024 B2 | 6/2007 | Scheuerlein et al. |
| 7,236,389 B2 | 6/2007 | Hsu |
| 7,247,876 B2 | 7/2007 | Lowrey |
| 7,273,791 B2 | 9/2007 | Basceri et al. |
| 7,323,349 B2 | 1/2008 | Hsu et al. |
| 7,335,906 B2 | 2/2008 | Toda |
| 7,388,775 B2 | 6/2008 | Bedeschi et al. |
| 7,393,785 B2 | 7/2008 | Uhlenbrock et al. |
| 7,405,967 B2 | 7/2008 | Kozicki et al. |
| 7,459,715 B2 | 12/2008 | Toda et al. |
| 7,465,675 B2 | 12/2008 | Koh |
| 7,473,982 B2 | 1/2009 | Aono et al. |
| 7,489,552 B2 | 2/2009 | Kurotsuchi et al. |
| 7,525,410 B2 | 4/2009 | Aono et al. |
| 7,538,338 B2 | 5/2009 | Rinerson et al. |
| 7,544,987 B2 | 6/2009 | Lu et al. |
| 7,557,424 B2 | 7/2009 | Wong et al. |
| 7,560,815 B1 | 7/2009 | Vaartstra et al. |
| 7,570,511 B2 | 8/2009 | Cho et al. |
| 7,639,523 B2 | 12/2009 | Celinska et al. |
| 7,666,526 B2 | 2/2010 | Chen et al. |
| 7,671,417 B2 | 3/2010 | Yoshida et al. |
| 7,679,812 B2 | 3/2010 | Sasagawa et al. |
| 7,687,793 B2 | 3/2010 | Harshfield et al. |
| 7,687,840 B2 | 3/2010 | Shinmura |
| 7,696,077 B2 | 4/2010 | Liu |
| 7,700,935 B2 | 4/2010 | Kim et al. |
| 7,727,908 B2 | 6/2010 | Ahn et al. |
| 7,751,163 B2 | 7/2010 | Duch et al. |
| 7,755,076 B2 | 7/2010 | Lung |
| 7,768,812 B2 | 8/2010 | Liu |
| 7,772,580 B2 | 8/2010 | Hofmann et al. |
| 7,777,215 B2 | 8/2010 | Chien et al. |
| 7,799,672 B2 | 9/2010 | Hashimoto et al. |
| 7,838,861 B2 | 11/2010 | Klostermann |
| 7,842,991 B2 | 11/2010 | Cho et al. |
| 7,864,568 B2 | 1/2011 | Fujisaki et al. |
| 7,898,839 B2 | 3/2011 | Aoki |
| 7,907,436 B2 | 3/2011 | Maejima et al. |
| 7,910,909 B2 | 3/2011 | Kim et al. |
| 7,948,784 B2 | 5/2011 | Kajigaya |
| 7,952,914 B2 | 5/2011 | Baek et al. |
| 7,990,754 B2 | 8/2011 | Azuma et al. |
| 8,021,897 B2 | 9/2011 | Sills et al. |
| 8,034,655 B2 * | 10/2011 | Smythe ............... H01L 45/04 257/4 |
| 8,043,926 B2 | 10/2011 | Cho et al. |
| 8,048,755 B2 | 11/2011 | Sandhu et al. |
| 8,094,477 B2 | 1/2012 | Maejima |
| 8,098,520 B2 | 1/2012 | Seigler et al. |
| 8,106,375 B2 | 1/2012 | Chen et al. |
| 8,124,968 B2 | 2/2012 | Koo et al. |
| 8,154,908 B2 | 4/2012 | Maejima et al. |
| 8,154,909 B2 | 4/2012 | Azuma et al. |
| 8,295,077 B2 | 10/2012 | Murooka |
| 8,355,274 B2 | 1/2013 | Arita et al. |
| 8,411,477 B2 | 4/2013 | Tang et al. |
| 8,436,414 B2 | 5/2013 | Tanaka et al. |
| 8,536,556 B2 | 9/2013 | Fukumizu |
| 8,537,592 B2 | 9/2013 | Liu |
| 8,542,513 B2 | 9/2013 | Tang et al. |
| 8,562,909 B2 | 10/2013 | Sills et al. |
| 8,611,121 B2 | 12/2013 | Ahn et al. |
| 8,791,447 B2 | 7/2014 | Liu et al. |
| 8,854,863 B2 | 10/2014 | Liu |
| 2002/0018355 A1 | 2/2002 | Johnson et al. |
| 2002/0034117 A1 | 3/2002 | Okazawa |
| 2002/0079524 A1 | 6/2002 | Dennison |
| 2002/0196695 A1 | 12/2002 | Pascucci |
| 2003/0031047 A1 | 2/2003 | Anthony et al. |
| 2003/0086313 A1 | 5/2003 | Asao |
| 2003/0174042 A1 | 9/2003 | Aono et al. |
| 2003/0174570 A1 | 9/2003 | Oishi |
| 2003/0185049 A1 | 10/2003 | Fricke et al. |
| 2003/0218902 A1 | 11/2003 | Perner et al. |
| 2003/0218929 A1 | 11/2003 | Fibranz |
| 2003/0223283 A1 | 12/2003 | Kunikiyo |
| 2004/0002186 A1 | 1/2004 | Vyvoda et al. |
| 2004/0090841 A1 | 5/2004 | Perner et al. |
| 2004/0100835 A1 | 5/2004 | Sugibayashi et al. |
| 2004/0108528 A1 | 6/2004 | Hsu et al. |
| 2004/0124407 A1 | 7/2004 | Kozicki et al. |
| 2004/0245547 A1 | 12/2004 | Stipe |
| 2005/0001257 A1 | 1/2005 | Scholesser et al. |
| 2005/0014325 A1 | 1/2005 | Aono et al. |
| 2005/0032100 A1 | 2/2005 | Heath et al. |
| 2005/0054119 A1 | 3/2005 | Hsu et al. |
| 2005/0128799 A1 | 6/2005 | Kurotsuchi et al. |
| 2005/0161747 A1 | 7/2005 | Lung et al. |
| 2005/0174835 A1 | 8/2005 | Rinerson et al. |
| 2005/0205943 A1 | 9/2005 | Yamada |
| 2005/0250281 A1 | 11/2005 | Ufert et al. |
| 2005/0269646 A1 | 12/2005 | Yamada |
| 2005/0287741 A1 | 12/2005 | Ding |
| 2006/0035451 A1 | 2/2006 | Hsu |
| 2006/0062049 A1 | 3/2006 | Lee et al. |
| 2006/0097238 A1 | 5/2006 | Breuil et al. |
| 2006/0099813 A1 | 5/2006 | Pan et al. |
| 2006/0104111 A1 | 5/2006 | Tripsas et al. |

(56) References Cited

U.S. PATENT DOCUMENTS

| | | |
|---|---|---|
| 2006/0110878 A1 | 5/2006 | Lung et al. |
| 2006/0160304 A1 | 7/2006 | Hsu et al. |
| 2006/0170027 A1 | 8/2006 | Lee et al. |
| 2006/0171200 A1 | 8/2006 | Rinerson et al. |
| 2006/0181920 A1 | 8/2006 | Ufert |
| 2006/0215445 A1 | 9/2006 | Baek et al. |
| 2006/0258079 A1 | 11/2006 | Lung et al. |
| 2006/0258089 A1 | 11/2006 | Chung-Zen |
| 2006/0274593 A1 | 12/2006 | Kurotsuchi et al. |
| 2006/0284242 A1* | 12/2006 | Jo ............ H01L 21/28273 257/316 |
| 2006/0286709 A1 | 12/2006 | Lung et al. |
| 2007/0010082 A1 | 1/2007 | Pinnow et al. |
| 2007/0015330 A1 | 1/2007 | Li et al. |
| 2007/0019923 A1 | 1/2007 | Sasagawa et al. |
| 2007/0034848 A1 | 2/2007 | Liu |
| 2007/0041235 A1 | 2/2007 | Inoue |
| 2007/0045615 A1 | 3/2007 | Cho et al. |
| 2007/0048990 A1 | 3/2007 | Zhuang et al. |
| 2007/0086235 A1 | 4/2007 | Kim et al. |
| 2007/0109835 A1 | 5/2007 | Hsu |
| 2007/0120124 A1 | 5/2007 | Chen et al. |
| 2007/0121369 A1 | 5/2007 | Happ |
| 2007/0123039 A1 | 5/2007 | Elkins et al. |
| 2007/0132049 A1 | 6/2007 | Stipe |
| 2007/0165434 A1 | 7/2007 | Lee et al. |
| 2007/0167008 A1 | 7/2007 | Hsu et al. |
| 2007/0171706 A1 | 7/2007 | Fuji |
| 2007/0173019 A1 | 7/2007 | Ho et al. |
| 2007/0176261 A1 | 8/2007 | Lung |
| 2007/0210348 A1 | 9/2007 | Song et al. |
| 2007/0224770 A1 | 9/2007 | Nagashima |
| 2007/0231988 A1 | 10/2007 | Yoo et al. |
| 2007/0246795 A1 | 10/2007 | Fang et al. |
| 2007/0257257 A1 | 11/2007 | Cho et al. |
| 2007/0258279 A1 | 11/2007 | Lung et al. |
| 2007/0267675 A1 | 11/2007 | Cho et al. |
| 2007/0268739 A1 | 11/2007 | Yoo et al. |
| 2007/0268742 A1 | 11/2007 | Liu |
| 2007/0269683 A1 | 11/2007 | Chen et al. |
| 2007/0278578 A1 | 12/2007 | Yoshida et al. |
| 2007/0285965 A1 | 12/2007 | Toda et al. |
| 2007/0295950 A1 | 12/2007 | Cho et al. |
| 2008/0001172 A1 | 1/2008 | Karg et al. |
| 2008/0008642 A1 | 1/2008 | Mori et al. |
| 2008/0012064 A1 | 1/2008 | Park et al. |
| 2008/0013363 A1 | 1/2008 | Kim et al. |
| 2008/0014750 A1 | 1/2008 | Nagashima |
| 2008/0026547 A1 | 1/2008 | Yin et al. |
| 2008/0029754 A1 | 2/2008 | Min et al. |
| 2008/0029842 A1 | 2/2008 | Symanczyk |
| 2008/0036508 A1 | 2/2008 | Sakamoto et al. |
| 2008/0048165 A1 | 2/2008 | Miyazawa |
| 2008/0049487 A1 | 2/2008 | Yoshimura et al. |
| 2008/0062740 A1 | 3/2008 | Baek et al. |
| 2008/0073635 A1 | 3/2008 | Kiyotoshi et al. |
| 2008/0078985 A1 | 4/2008 | Meyer et al. |
| 2008/0080229 A1 | 4/2008 | Choi et al. |
| 2008/0089105 A1 | 4/2008 | Ro et al. |
| 2008/0093591 A1 | 4/2008 | Khang et al. |
| 2008/0099753 A1 | 5/2008 | Song et al. |
| 2008/0102278 A1 | 5/2008 | Kreupl et al. |
| 2008/0105862 A1 | 5/2008 | Lung et al. |
| 2008/0106925 A1 | 5/2008 | Paz De Araujo et al. |
| 2008/0157257 A1 | 7/2008 | Bertin et al. |
| 2008/0175031 A1 | 7/2008 | Park et al. |
| 2008/0175032 A1 | 7/2008 | Tanaka et al. |
| 2008/0185571 A1 | 8/2008 | Happ et al. |
| 2008/0185687 A1 | 8/2008 | Hong et al. |
| 2008/0232160 A1 | 9/2008 | Gopalakrishnan |
| 2008/0247219 A1 | 10/2008 | Choi et al. |
| 2008/0251779 A1 | 10/2008 | Kakosehke et al. |
| 2008/0258126 A1 | 10/2008 | Lung |
| 2008/0259672 A1 | 10/2008 | Lung |
| 2008/0303014 A1 | 12/2008 | Goux et al. |
| 2009/0014706 A1 | 1/2009 | Lung |
| 2009/0014707 A1 | 1/2009 | Lu et al. |
| 2009/0026436 A1 | 1/2009 | Song et al. |
| 2009/0057640 A1 | 3/2009 | Lin et al. |
| 2009/0059644 A1 | 3/2009 | Kajigaya et al. |
| 2009/0072217 A1 | 3/2009 | Klostermann |
| 2009/0085121 A1 | 4/2009 | Park et al. |
| 2009/0097295 A1 | 4/2009 | Morimoto |
| 2009/0141547 A1 | 6/2009 | Jin et al. |
| 2009/0173930 A1 | 7/2009 | Yasuda et al. |
| 2009/0180309 A1 | 7/2009 | Liu |
| 2009/0207647 A1 | 8/2009 | Maejima et al. |
| 2009/0207681 A1 | 8/2009 | Juengling |
| 2009/0218557 A1 | 9/2009 | Sato |
| 2009/0250681 A1 | 10/2009 | Smythe et al. |
| 2009/0261314 A1 | 10/2009 | Kim et al. |
| 2009/0261343 A1 | 10/2009 | Herner et al. |
| 2009/0267047 A1 | 10/2009 | Sasago et al. |
| 2009/0268532 A1 | 10/2009 | DeAmbroggi et al. |
| 2009/0272959 A1 | 11/2009 | Phatak et al. |
| 2009/0272960 A1 | 11/2009 | Srinivasan et al. |
| 2009/0272961 A1 | 11/2009 | Miller et al. |
| 2009/0272962 A1 | 11/2009 | Kumar et al. |
| 2009/0273087 A1 | 11/2009 | French et al. |
| 2009/0278109 A1 | 11/2009 | Phatak |
| 2009/0303780 A1 | 12/2009 | Kasko et al. |
| 2009/0315090 A1 | 12/2009 | Weis et al. |
| 2009/0316467 A1 | 12/2009 | Liu |
| 2009/0316474 A1 | 12/2009 | Cho et al. |
| 2009/0317540 A1 | 12/2009 | Sandhu et al. |
| 2009/0323385 A1 | 12/2009 | Scheuerlein et al. |
| 2010/0003782 A1 | 1/2010 | Sinha et al. |
| 2010/0008163 A1 | 1/2010 | Liu |
| 2010/0044666 A1 | 2/2010 | Baek et al. |
| 2010/0046273 A1 | 2/2010 | Azuma et al. |
| 2010/0065836 A1 | 3/2010 | Lee et al. |
| 2010/0072452 A1 | 3/2010 | Kim et al. |
| 2010/0084741 A1 | 4/2010 | Andres |
| 2010/0085798 A1 | 4/2010 | Lu et al. |
| 2010/0090187 A1 | 4/2010 | Ahn et al. |
| 2010/0110759 A1 | 5/2010 | Jin et al. |
| 2010/0123542 A1 | 5/2010 | Vaithyanathan et al. |
| 2010/0135061 A1 | 6/2010 | Li et al. |
| 2010/0140578 A1 | 6/2010 | Tian et al. |
| 2010/0157657 A1 | 6/2010 | Rinerson et al. |
| 2010/0157658 A1 | 6/2010 | Schloss et al. |
| 2010/0163820 A1 | 7/2010 | Son |
| 2010/0163829 A1 | 7/2010 | Wang et al. |
| 2010/0176368 A1 | 7/2010 | Ko et al. |
| 2010/0178729 A1 | 7/2010 | Yoon et al. |
| 2010/0193758 A1 | 8/2010 | Tian et al. |
| 2010/0193761 A1 | 8/2010 | Amin et al. |
| 2010/0193762 A1 | 8/2010 | Hseih et al. |
| 2010/0195371 A1 | 8/2010 | Ohba et al. |
| 2010/0232200 A1 | 9/2010 | Shepard |
| 2010/0237442 A1 | 9/2010 | Li et al. |
| 2010/0243983 A1 | 9/2010 | Chiang et al. |
| 2010/0258782 A1 | 10/2010 | Kuse et al. |
| 2010/0259960 A1 | 10/2010 | Samachisa |
| 2010/0259961 A1 | 10/2010 | Fasoli et al. |
| 2011/0059576 A1 | 3/2011 | Cho et al. |
| 2011/0128775 A1 | 6/2011 | Maejima et al. |
| 2011/0193044 A1 | 8/2011 | Sandhu et al. |
| 2011/0261606 A1 | 10/2011 | Sandhu et al. |
| 2011/0261607 A1 | 10/2011 | Tang et al. |
| 2011/0309322 A1 | 12/2011 | Hwang |
| 2012/0147648 A1 | 6/2012 | Scheuerlein |
| 2012/0248399 A1 | 10/2012 | Sasago et al. |

FOREIGN PATENT DOCUMENTS

| | | |
|---|---|---|
| CN | 1459792 | 12/2003 |
| CN | 1624803 | 6/2005 |
| CN | 101005113 | 12/2006 |
| CN | 101051670 | 4/2007 |
| CN | 101034732 | 9/2007 |
| CN | 101256831 | 9/2008 |
| CN | 101350360 | 1/2009 |
| CN | 101546602 | 9/2009 |

(56) References Cited

FOREIGN PATENT DOCUMENTS

| | | |
|---|---|---|
| CN | 200880124714.6 | 7/2012 |
| CN | 201180027954.6 | 5/2014 |
| CN | 200180065042.8 | 5/2015 |
| CN | 201180057866.0 | 11/2015 |
| EP | GB 1266513 | 3/1972 |
| EP | 1796103 | 9/2006 |
| EP | 11792836 | 12/2013 |
| EP | 11845727.4 | 11/2014 |
| EP | 11834802 | 3/2015 |
| EP | 14171745 | 3/2015 |
| JP | 2005175457 | 6/2005 |
| JP | 2005-353779 | 12/2005 |
| JP | 2006032729 | 2/2006 |
| JP | 2006040981 | 2/2006 |
| JP | 2006074028 | 3/2006 |
| JP | 2006121044 | 5/2006 |
| JP | 2008-192995 | 8/2008 |
| JP | 2009-081251 | 4/2009 |
| JP | 2009-163867 | 7/2009 |
| JP | 2009-267411 | 11/2009 |
| JP | 2010-009669 | 1/2010 |
| JP | 2010-010688 | 1/2010 |
| JP | 2010-192569 | 9/2010 |
| JP | 2010-192646 | 9/2010 |
| JP | 2010-232214 | 10/2010 |
| JP | 2010-263211 | 11/2010 |
| KR | 2003-0048421 | 6/2003 |
| KR | 2005-0008353 | 1/2005 |
| KR | 1020060087882 | 8/2006 |
| KR | 10-0751736 | 8/2007 |
| KR | 20070111840 | 11/2007 |
| KR | 20070118865 | 12/2007 |
| KR | 20090109804 | 10/2009 |
| KR | 2010-0078808 | 7/2010 |
| KR | 20100083402 | 7/2010 |
| TW | 097147549 | 5/2013 |
| TW | 100119681 | 8/2013 |
| TW | 100142963 | 8/2014 |
| TW | 101102280 | 8/2014 |
| WO | WO 2006/003620 | 1/2006 |
| WO | WO 2008/029446 | 3/2008 |
| WO | PCT/US2008/084422 | 3/2009 |
| WO | WO 2009/127187 | 10/2009 |
| WO | WO 2010/068221 | 6/2010 |
| WO | PCT/US2008/084422 | 7/2010 |
| WO | WO 2010/082922 | 7/2010 |
| WO | WO 2010/082923 | 7/2010 |
| WO | WO 2010/082928 | 7/2010 |
| WO | WO 2010/085241 | 7/2010 |
| WO | WO 2010/087854 | 8/2010 |
| WO | WO 2010/101340 | 9/2010 |
| WO | WO 2010-117911 | 10/2010 |
| WO | PCT/US2011/035601 | 11/2011 |
| WO | PCT/US2011/051785 | 4/2012 |
| WO | PCT/US2011/059095 | 5/2012 |
| WO | PCT/US2012/021168 | 7/2012 |
| WO | PCT/US2011/066770 | 9/2012 |
| WO | PCT/US2011/035601 | 12/2012 |
| WO | PCT/US2011/051785 | 4/2013 |
| WO | PCT/US2011/059095 | 6/2013 |
| WO | PCT/US2011/066770 | 7/2013 |

OTHER PUBLICATIONS

U.S. Appl. No. 12/141,559, filed Jun. 18, 2008, Sandhu et al.
U.S. Appl. No. 12/166,604, filed Jul. 2, 2008, Sinha et al.
U.S. Appl. No. 12/701,885, filed Feb. 8, 2010, Sandhu et al.
U.S. Appl. No. 12/765,598, filed Apr. 22, 2010, Sadhu et al.
U.S. Appl. No. 12/765,606, filed Apr. 22, 2010, Tang et al.
U.S. Appl. No. 12/959,015, filed Dec. 2, 2010, Liu.
U.S. Appl. No. 12/979,189, filed Dec. 27, 2010, Sills et al.
U.S. Appl. No. 13/010,048, filed Jan, 20, 2011, Liu et al.

"Programmable metallization cell", Dec. 11, 2007. Downloaded from http://en.wikipedia.org/wiki/Programmable_metallization_cell on Dec. 13, 2011.
Baek et al., "Multi-layer Cross-point Binary Oxide Resistive Memory (OxRRAM) for Post-NAND Storage Application", IEEE, 2005.
Bedeschi et al., "A Bipolar-Selected Phase Change Memory Featuring Multi-Level Cell Storage", IEEE, vol. 44, No. 1, Jan. 2009, pp. 217-227.
Chen et al., "Non-Volatile Resistive Switching for Advanced Memory Applications", IEEE, 2005, 4 pages.
Chen et al., "Perovskite RRAM Devices with Metal/Insulator/PCMO/Metal Heterostructuers", IEEE, 2005, pp. 125-128.
Choi et al., "Defect Structure and Electrical Properties of Single-Crystal Ba0.03SR0.97TiO3", J. Am. Ceram. Soc., 71, [4], pp. 201-205, 1988.
Courtade et al., "Microstructure and resistance switching in NiO binary oxide films obtained from Ni oxidation", IEEE, 2006, pp. 94-99.
Higaki et al., "Effects of Gas Phase Absorption into Si Substrates on Plasma doping Process", Dept. of Advanced Applied Electronics; UJT Laboratory Inc.;Frontier Collaborative Research Center, 4 pgs.
Ho et al., "A Highly Reliable Self-Aligned Graded Oxide WOx Resistance Memory: Conduction Mechanisms and Reliability", 2007 Symposium on VLSI Technology Digest of Technical Papers, pp. 228-229.
Hosoi et al., "High Speed Unipolar Switching Resistance RAM (RRAM) Technology", Advanced Materials Res. Lab, Japan; Correlated Electron Res. Center (CERC), Japan; Nanotechnology Res. Inst. (NRI), Japan, 4 pages.
Hudgens et al., "Overview of Phase-Change Chalcogenide Nonvolatile Memory Technology", MRS Bulletin, Nov. 2004, pp. 829-832.
Ignatiev et al., "Resistance Non-volatile Memory-RRAM" Mater. Res. Soc. Symp. Proc., vol. 997, 2007, Materials Research Society, 9 pages.
Karg et al., "Nanoscale Resistive Memory Device Using SrTiO3 Films", IEEE, 2007, pp. 68-70.
Kau et al., "A Stackable cross point phase change memory", IEEE, 2009, pp. 27.1.1-27.1.4.
Komori et al., Disturbless flash memory due to high boost efficiency on BiCS structure and optimal memory film stack for ultra high density storage device; Dec. 2008; pp. 851-854.
Kooij et al., "Photoselective Metal Deposition on Amorphous Silicon p-i-n Solar Cells", Electrochemical Society Letters, Journal of electrochemical Society vol. 44, No. 10, Oct. 1997, pp. L271-L272.
Kozicki et al., "Non-Volatile Memory Based on Solid Electrolytes" Center for Solid State Electronics Research, Arizona State University, 8 pgs.
Kozicki, "Memory Devices Based on Solid Electrolytes" Mater. Res. Soc. Symp. Proc. vol. 997, 2007, Materials Research Society, 10 pages.
Lee et al., "2-stack 1D-1R Cross-point Structure with Oxide Diodes as Switch Elements for High Density Resistance RAM Applications", IEEE, 2007 pp. 771-774.
Lee et al., "Resistance Switching of Al doped ZnO for Non Volatile Memory Applications", Dept of Materials Science and Engineering, Gwangju Institute of Science and Technology, 2 pages.
Lin et al., "Effect of Top Electrode Material on Resistive Switching Properties of ZrO2 Film Memory Devices", IEEE, May 2007, vol. 28, No. 5, pp. 366-368.
Meyer et al., "Oxide Dual-Layer Memory Element for Scalable Non-Volatile Cross-Point Memory Technology", IEEE, 2008, 5 pages.
Miyashita et al., "A Novel Bit-Line Process using Poly-Si Masked Dual-Damascene (PMDD) for 0.13 um DRAMs and Beyond", IEEE, 2000, pp. 15.4.1-15.4.4.
Muller et al., "Emerging Non-Volatile Memory Technologies", IEEE, 2003, pp. 37-44.
Oh, "Full Integration of Highly Manufacturable 512Mb PRAM based on 90nm Technology" 2006 IEEE, 4 pages.

(56) References Cited

OTHER PUBLICATIONS

Pein et al., "Performance of the 3-D Pencil Flash EPROM Cell and Memory Array", IEEE, 1995, pp. 1982-1991.
Pellizzer et al., "A 90nm Phase Change Memory Technology for Stand-Alone Non-Volatile Memory Applications", IEEE, 2006, Symposium on VLSI Technology Digest of Technical Papers, 2 pages. Abstract Only.
Pirovano et al., "Self-Aligned u Trench Phase-Change Memory Cell Architecture fo 90nm Technology and Beyond", IEEE, 2007, pp. 222-225. Abstract Only.
Scheck et al., "Selective Metal Electrodeposition through doping modulation of semiconductor surfaces", Applied Physics Letters 86, 2005, 3 pgs.
Wikipedia, Despotuli et al., "Programmable Metallization Cell", pp. 1-4, Dec. 11, 2007, Place of Publication: Internet.
Wuttig, "Towards a Universal Memory?" Nature Materials, vol. 4, Apr. 2005, pp. 265-266.
Xing et al., "Characterization of AlGaN//GaN p-n Diodes with Selectively Regrown n-AlGaN by Metal-Organic Chemical-Vapor Deposition and its Application to GaN-Based Bipolar Transistors", Journal of Applied Physics 97, 2005, 4 pgs.
Yih et al., "SiC/Si Heterojunction Diodes Fabricated by Self-Selective and by Blanket Rapid Thermal Chemical Vapor Deposition", IEEE vol. 41 No. 3, Mar. 1994, pp. 281-287.
Yoon et al., "Vertical Cross-point Resistance Change Memory for Ultra-High Density Non-volatile Memory Applications", 2009 Symposium on VLSI Technology Digest of Technical Papers, pp. 26-27.
Yu et al., "Structure Effects on Resistive Switching of Al/TiOx/Al Devices for RRAM Applications", IEEE, 2008, pp. 331-333.

\* cited by examiner

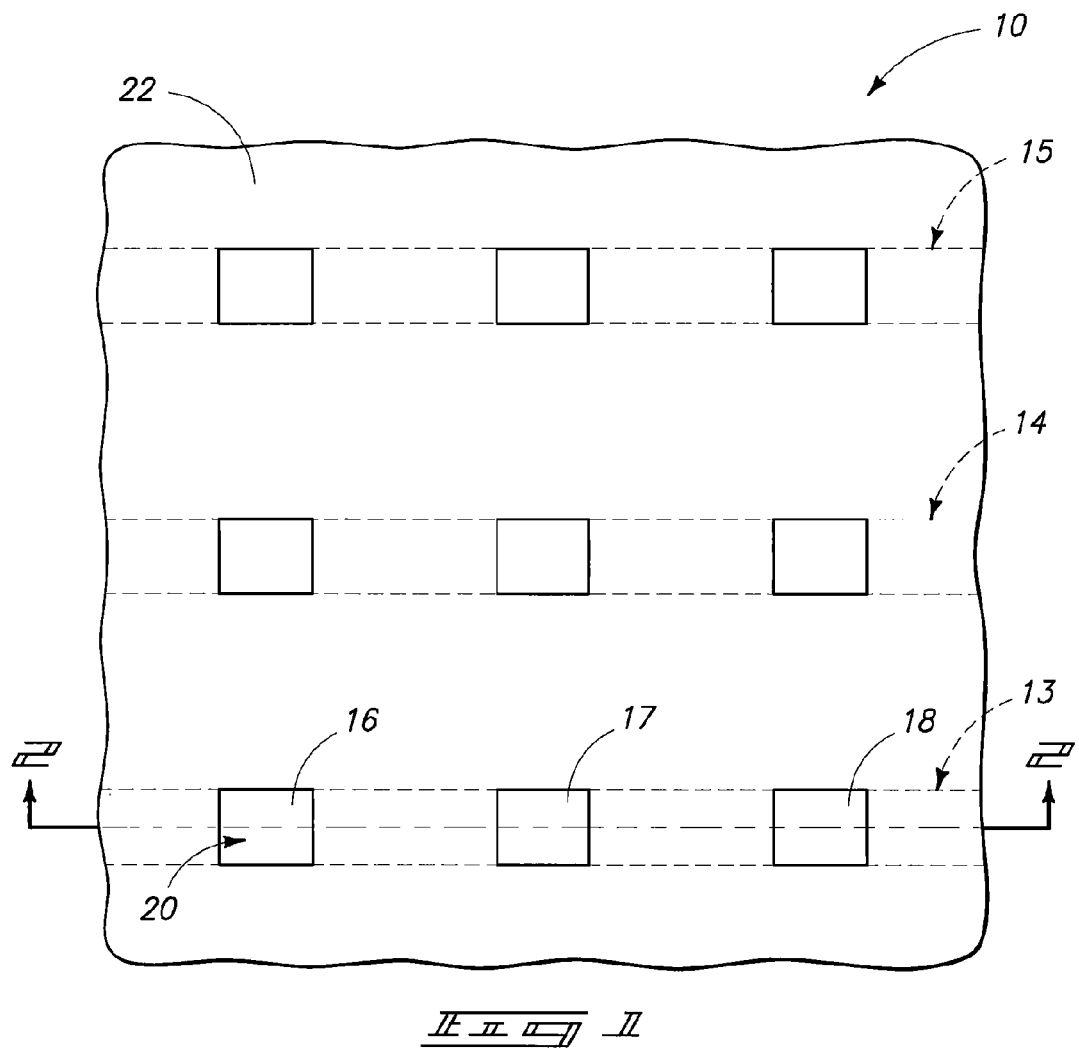
_FIG_ 1
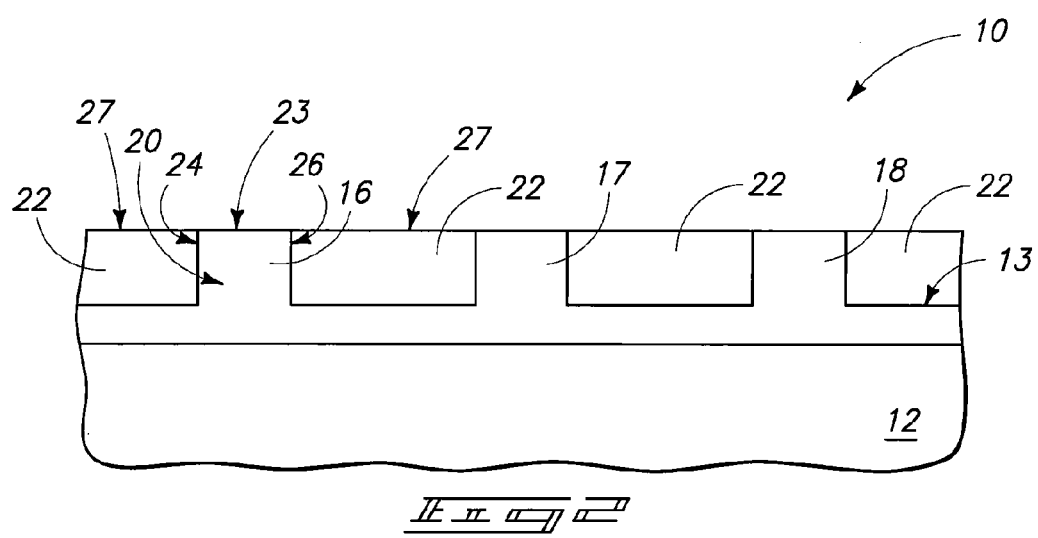
_FIG_ 2

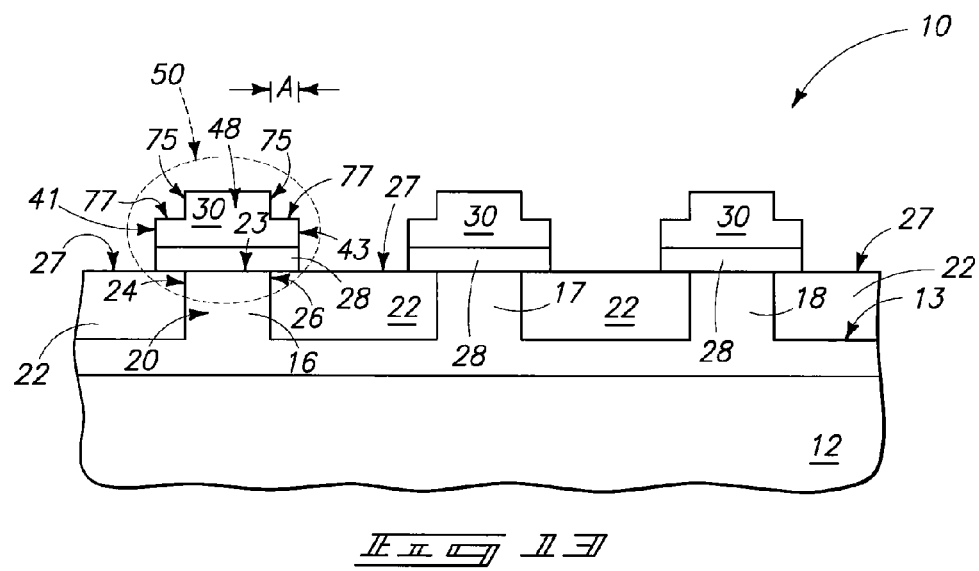
_FIG. 13_
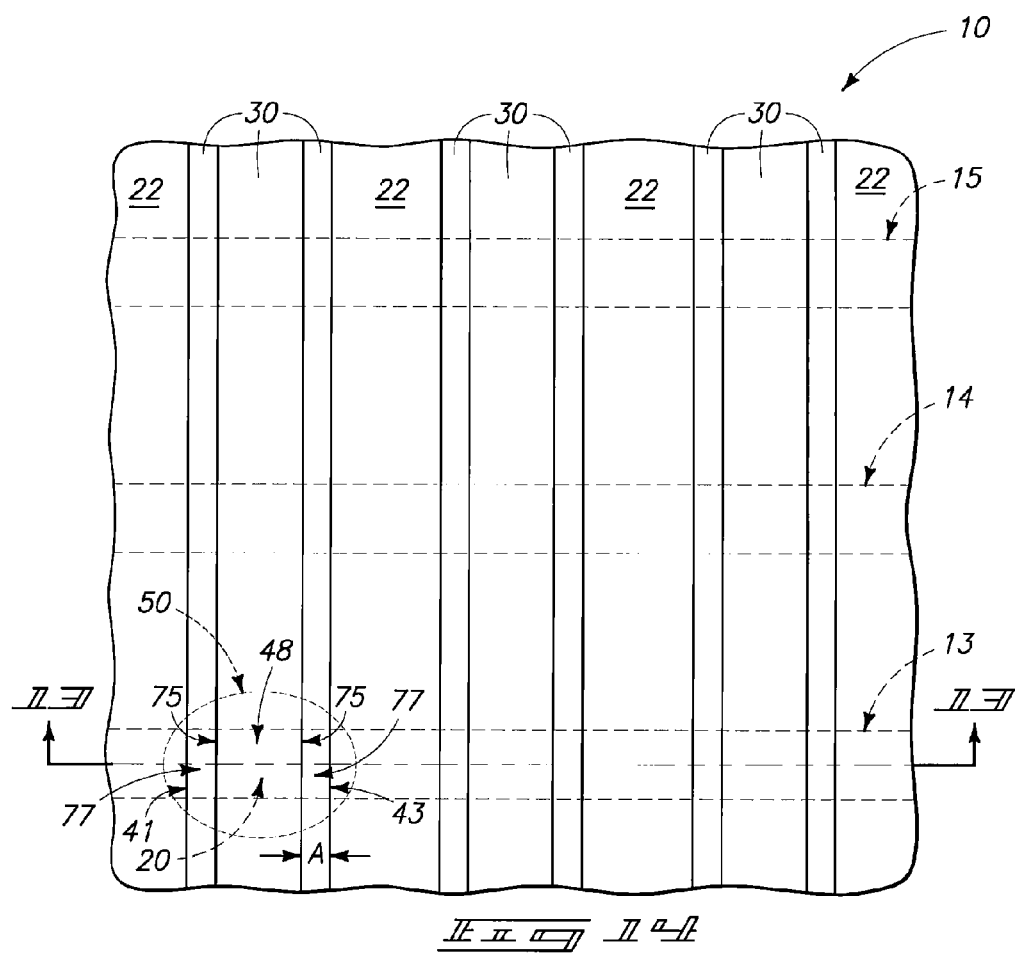
_FIG. 14_

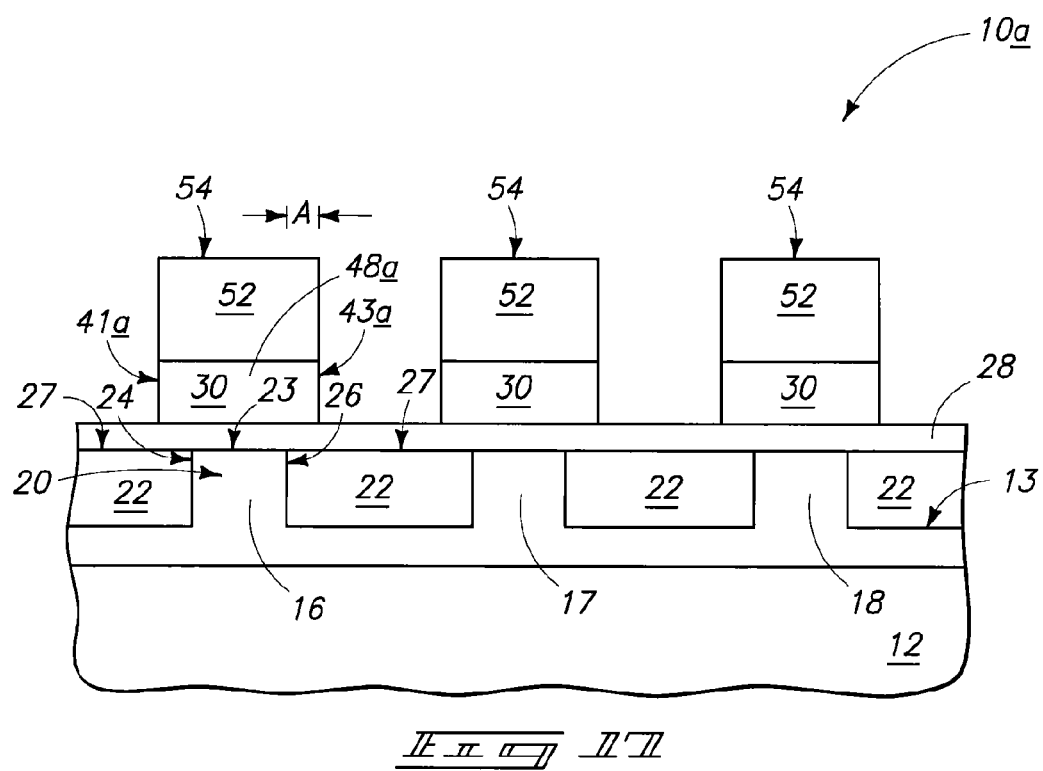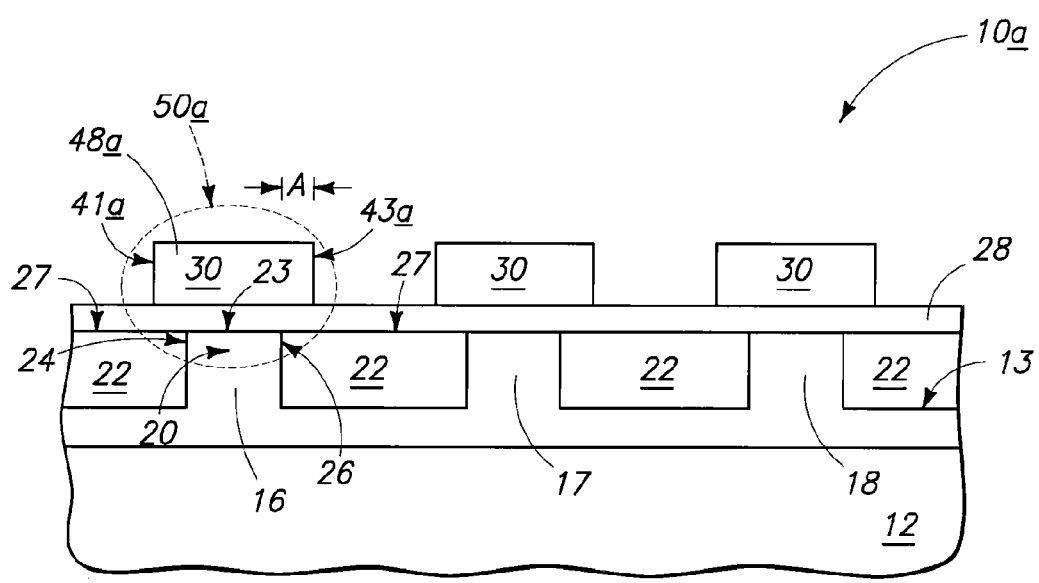

NON-VOLATILE RESISTIVE OXIDE MEMORY CELLS AND METHODS OF FORMING NON-VOLATILE RESISTIVE OXIDE MEMORY CELLS

RELATED PATENT DATA

This patent resulted from a divisional application of U.S. patent application Ser. No. 12/114,096, filed May 2, 2008, entitled "Methods of Forming Non-Volatile Memory Cells Having Multi-resistive State Material Between Conductive Electrodes Oxide Memory Cells", naming Bhaskar Srinivasan, Gurtej Sandhu, and John Smythe as inventors, the disclosure of which is incorporated by reference.

TECHNICAL FIELD

Embodiments disclosed herein pertain to non-volatile resistive oxide memory cells and to methods of forming non-volatile resistive oxide memory cells.

BACKGROUND

Memory is one type of integrated circuitry, and is used in computer systems for storing data. Such is typically fabricated in one or more arrays of individual memory cells. The memory cells might be volatile, semi-volatile, or non-volatile. Non-volatile memory cells can store data for extended periods of time, and in many instances including when the computer is turned off. Volatile memory dissipates and therefore requires to be refreshed/rewritten, and in many instances including multiple times per second. Regardless, the smallest unit in each array is termed as a memory cell and is configured to retain or store memory in at least two different selectable states. In a binary system, the storage conditions are considered as either a "0" or a "1". Further, some individual memory cells can be configured to store more than two levels of information.

Integrated circuitry fabrication continues to strive to produce smaller and denser integrated circuits. Accordingly, the fewer components an individual circuit device has, the smaller the construction of the finished device can be. Likely the smallest and simplest memory cell will be comprised of two conductive electrodes having a programmable material received there-between. Example materials include metal oxides which may or may not be homogenous, and may or may not contain other materials therewith. Regardless, the collective material received between the two electrodes is selected or designed to be configured in a selected one of at least two different resistive states to enable storing of information by an individual memory cell. When configured in one extreme of the resistive states, the material may have a high resistance to electrical current. In contrast in the other extreme, when configured in another resistive state, the material may have a low resistance to electrical current. Existing and yet-to-be developed memory cells might also be configured to have one or more additional possible stable resistive states in between a highest and a lowest resistance state. Regardless, the resistive state in which the programmable material is configured may be changed using electrical signals. For example, if the material is in a high-resistance state, the material may be configured to be in a low resistance state by applying a voltage across the material.

The programmed resistive state is designed to be persistent in non-volatile memory. For example, once configured in a resistive state, the material stays in such resistive state even if neither a current nor a voltage is applied to the material. Further, the configuration of the material may be repeatedly changed from one resistance state to another for programming the memory cell into different of at least two resistive states. Upon such programming, the resistive state of the material can be determined by appropriate signals applied to one or both of the two electrodes between which the material is received.

Certain metal oxides can be used as such materials in resistive memory cells. During fabrication, the materials which make up the memory elements are deposited and patterned to produce a desired finish shape and construction of the individual memory cells in an array of such cells. Accordingly, a conductive material is deposited for one of the electrodes, followed by deposition of at least some metal oxide for the programmable region, and followed by deposition of more conductive material for the other electrode of the memory cell. Often, the first and second conductive layers are fabricated as elongated conductive lines which run generally parallel an outermost major surface of the substrate upon which such are fabricated, yet orthogonal relative to one another.

Regardless, the three different regions of the memory cell are often patterned by etching using multiple masking and etching steps. Such typically include anisotropic plasma etching through the conductive outer electrode material inwardly at least to the metal oxide which will be the programmable region of the memory cell. Further, usually subsequent plasma etching is conducted through the metal oxide to the lower electrode conductive material. Regardless, exposure of the metal oxide material to plasma etching can adversely affect the operation of the memory cell in that composition and/or structure of the metal oxide material may be modified in an unpredictable manner.

BRIEF DESCRIPTION OF THE DRAWINGS

FIG. 1 is a diagrammatic top plan view of a semiconductor substrate fragment in process in accordance with an embodiment of the invention.

FIG. 2 is a cross sectional view of the FIG. 1 substrate fragment comprising a planar cross section taken through line 2-2 in FIG. 1.

FIG. 13 is a view of the FIG. 12 substrate fragment at a processing step subsequent to that shown by FIG. 12.

FIG. 14 is a top plan view of the FIG. 13 substrate fragment, with FIG. 13 being taken through line 13-13 in FIG. 14.

FIG. 17 is a view of the FIG. 16 substrate fragment at a processing step subsequent to that shown by FIG. 16.

FIG. 18 is a view of the FIG. 17 substrate fragment at a processing step subsequent to that shown by FIG. 17.

DETAILED DESCRIPTION OF EXAMPLE EMBODIMENTS

Figure 3:
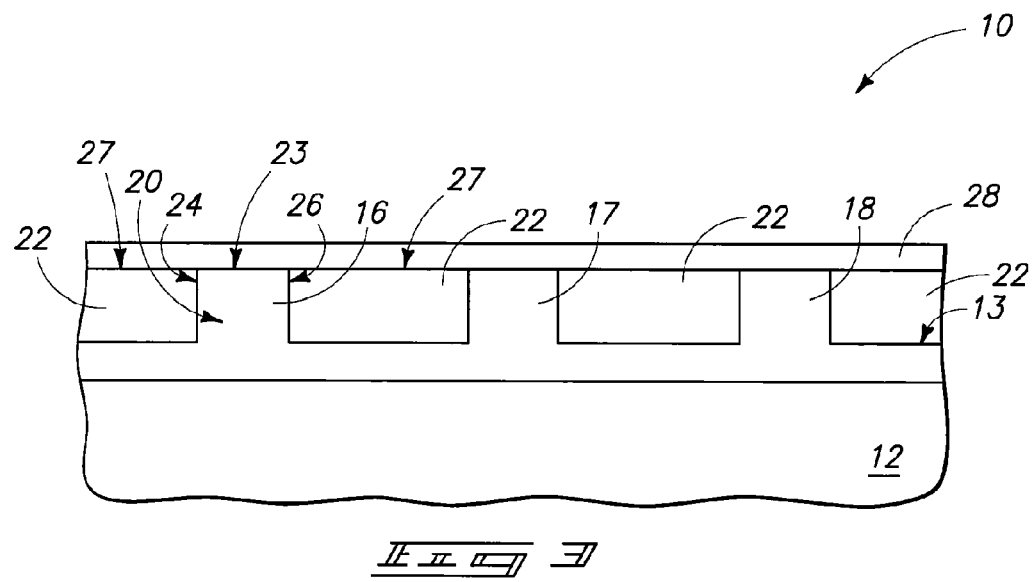
FIG. 3 is a view of the FIG. 2 substrate fragment at a processing step subsequent to that shown by FIG. 2.

Example embodiments of the invention are initially described with reference to FIGS. 1-14. Referring initially to FIGS. 1 and 2, a substrate, for example a semiconductor substrate is indicated generally with reference numeral 10. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate fragment 10 comprises material 12 over which a series of conductive lines 13, 14 and 15 have been fabricated. Multiple different materials and layers would likely be present at least below material 12, and may for example comprise bulk semiconductor processing, semiconductor-on-insulator processing, or other substrates in process and whether existing or yet-to-be developed. In one example, material 12 is insulative, for example doped and/or undoped silicon dioxide.

In certain aspects, embodiments of the invention include a non-volatile resistive oxide memory cell, as well as methods of fabricating a non-volatile resistive oxide memory cell. Such methods are not limited by structure, and such structures are not limited by the methods unless literally limiting language appears in a claim under analysis. In one implementation, a plurality of non-volatile resistive oxide memory cells will be fabricated substantially simultaneously over the substrate, for example arranged in an array of such memory cells.

For example in the depicted embodiment and for ease of description, conductive line 13 can be considered as a first conductive line which will electrically connect with a plurality of non-volatile resistive oxide memory cells within an array of such cells. FIGS. 1 and 2 depict a plurality of conductive projections 16, 17 and 18 which extend upwardly from first conductive line 13. In one embodiment, such will comprise first conductive electrodes of respective non-volatile resistive oxide memory cells. The discussion proceeds with reference to fabrication of a single memory cell incorporating conductive projection 16 as a first conductive electrode 20 of a non-volatile resistive oxide memory cell which is being fabricated. A first conductive electrode of a non-volatile resistive oxide memory cell fabricated in accordance with method and apparatus embodiments may comprise any existing or yet-to-be developed construction and configuration, and may or may not comprise a conductive projection extending upwardly from a conductive line. Further where such does comprise some conductive projection extending upwardly from a conductive line, such may be of the same composition or different composition from that of the conductive line. By way of example only, conductive line 13 and projections 16, 17 and 18 are depicted as being of the same composition, and may comprise one or more conductive materials including conductively doped semiconductive material. An example manner of fabricating conductive line 13 includes initial deposition of one or more conductive materials to a thickness at or greater than the thickness of a conductive projection including that of the underlying conductive line. The outline of the conductive lines can then be patterned, for example as shown in FIG. 1. This can be followed by cross-patterning of the conductive projections using a timed etch into the conductive material from which such projections and lines are formed. Other manners of fabrication might be used.

Substrate 10 comprises insulative material 22. Such may be homogenous or non-homogenous, and comprise one or multiple different layers. Doped silicon dioxides such as borophosphosilicate glass (BPSG), phosphosilicate glass (PSG), borosilicate glass (BSG), and undoped silicon dioxides are examples. By way of example only, such might be blanketly deposited over substrate 10 followed by etching or polishing back to expose outermost surfaces of the depicted conductive projections. Regardless, such provides but one example of forming or providing conductive first electrode material 16 received within insulative material 22.

First conductive electrode 20, for purposes of the continuing discussion, can be considered as having an elevationally outermost surface 23 and opposing laterally outermost edges 24, 26 at elevationally outermost surface 23 in one planar cross section, for example the planar cross section across electrode 20 defined as part of line 2-2 in FIG. 1 and depicted as the plane of the page upon which FIG. 2 lies. Further, insulative material 22 can be considered as comprising an elevationally outer surface 27 in the example one planar cross section. In one embodiment, elevationally outermost surface 23 of first conductive electrode 20 is planar, and in one embodiment elevationally outer surface 27 of insulative material 22 is planar. In the depicted example embodiment, such are coplanar in FIG. 2.

Referring to FIG. 3, a multi-resistive state layer 28 comprising multi-resistive state metal oxide-comprising material has been formed over first conductive electrode 20. Layer 28 may or may not comprise an outermost planar surface. Layer 28 may be homogenous or non-homogenous, and may comprise one or more different compositions and/or layers. Accordingly, the material of layer 28 may be deposited/formed in one or more steps. By ways of example only, such might comprise two different layers or regions generally regarded as or understood to be active or passive regions, although not necessarily. Example active cell region compositions which comprise metal oxide and can be configured in multi-resistive states include one or a combination of $Sr_xRu_yO_z$, $Ru_xO_y$, and $In_xSn_yO_z$. Other examples include MgO, $Ta_2O_5$, $SrTiO_3$, $ZrO_x$ (perhaps doped with La), and $CaMnO_3$ (doped with one or more of Pr, La, Sr, or Sm). Example passive cell region compositions include one or a combination of $Al_2O_3$, $TiO_2$, and $HfO_2$. Regardless, multi-resistive state layer 28 might comprise additional metal oxide or other materials not comprising metal oxide. Example materials and constructions for a multi-resistive state region comprising one or more layers including a programmable metal oxide-comprising material are described and disclosed in U.S. Pat. Nos. 6,753,561; 7,149,108; 7,067,862; and 7,187,201, as well as in U.S. Patent Application Publication Nos. 2006/0171200 and 2007/0173019, the disclosures of which are hereby fully incorporated herein by reference for all purposes of this disclosure.

In the depicted example embodiment, multi-resistive state metal oxide-comprising material of layer 28 has also been formed over elevationally outer surface 27 of insulative material 22. Alternately by way of example only, layer 28 might only be formed over respective first conductive electrodes 20, for example by some selective deposition process, or by a deposition followed by patterned subtractive etching.

Figure 4:
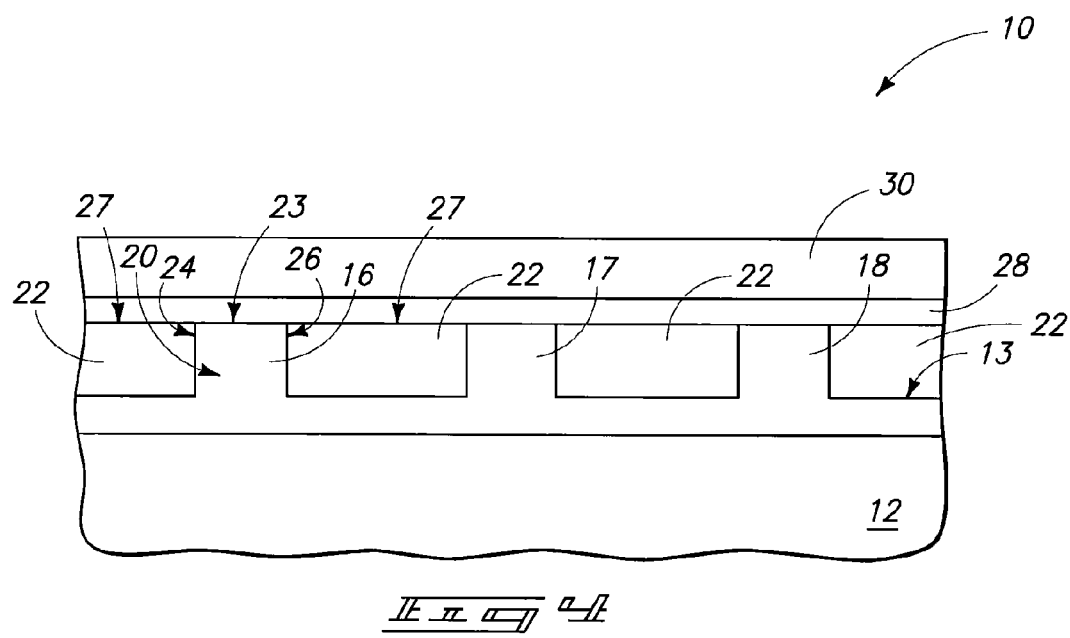
FIG. 4 is a view of the FIG. 3 substrate fragment at a processing step subsequent to that shown by FIG. 3.

Referring to FIG. 4, conductive material 30 has been deposited over multi-resistive state metal oxide-comprising material 28. Conductive material 30 may be homogenous or non-homogenous, and regardless be of the same or different composition(s) from that of conductive material of first electrode 20.

Figure 5:
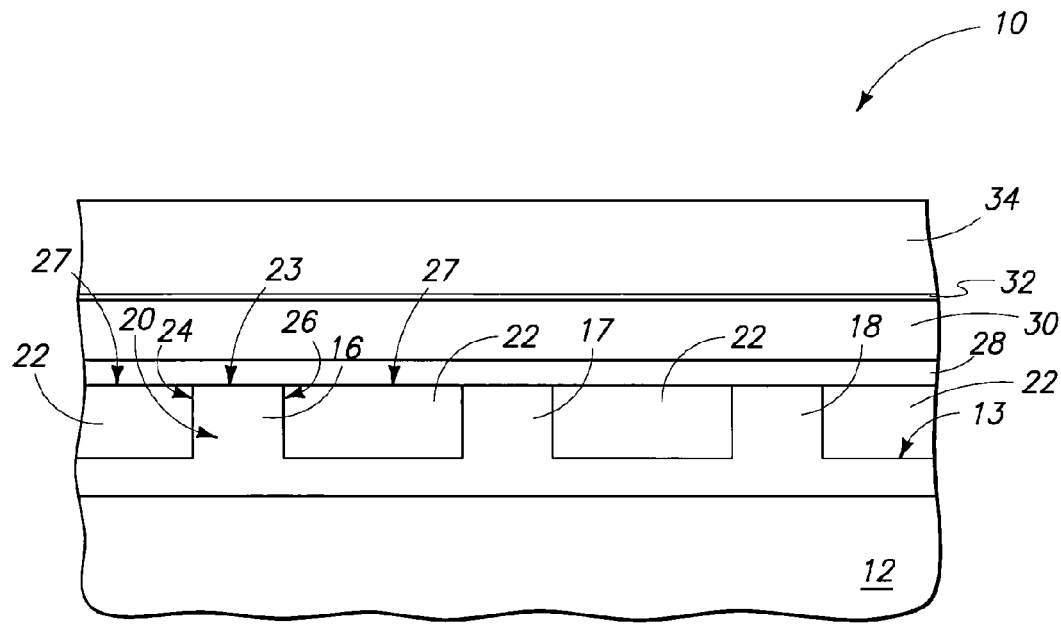
FIG. 5 is a view of the FIG. 4 substrate fragment at a processing step subsequent to that shown by FIG. 4.

Referring to FIG. 5, first and second materials 32, 34, respectively, have been formed over conductive material 30, and are formed to be of different composition relative one another. Each might be homogenous or non-homogenous. An example second material 34 comprises photoresist, including multi layer resist materials. Example materials 32 include silicon nitride, silicon carbide, and amorphous carbon. In one embodiment, second material 34 is deposited to a thickness of from 3 to 10 times that of first material 32.

Figure 6:
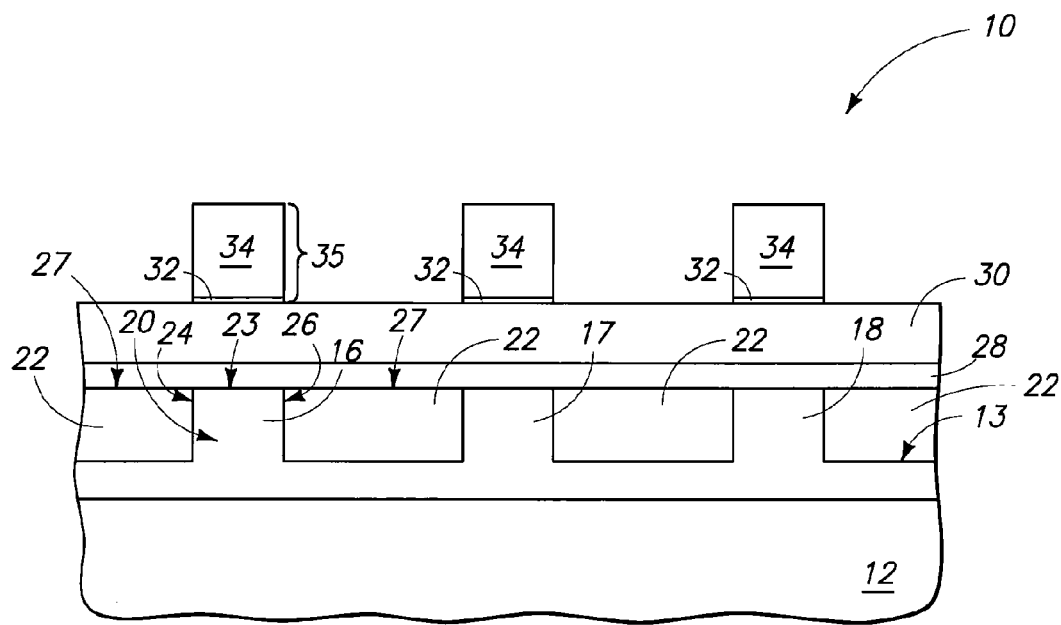
FIG. 6 is a view of the FIG. 5 substrate fragment at a processing step subsequent to that shown by FIG. 5.

Referring to FIG. 6, first and second materials 32 and 34 have been patterned to form an etch mask 35 over conductive material 30 in the planar cross section depicted by FIG. 6 across first electrode 20. Alternate etch masks which may or may not be homogenous may also be used.

Figure 7:
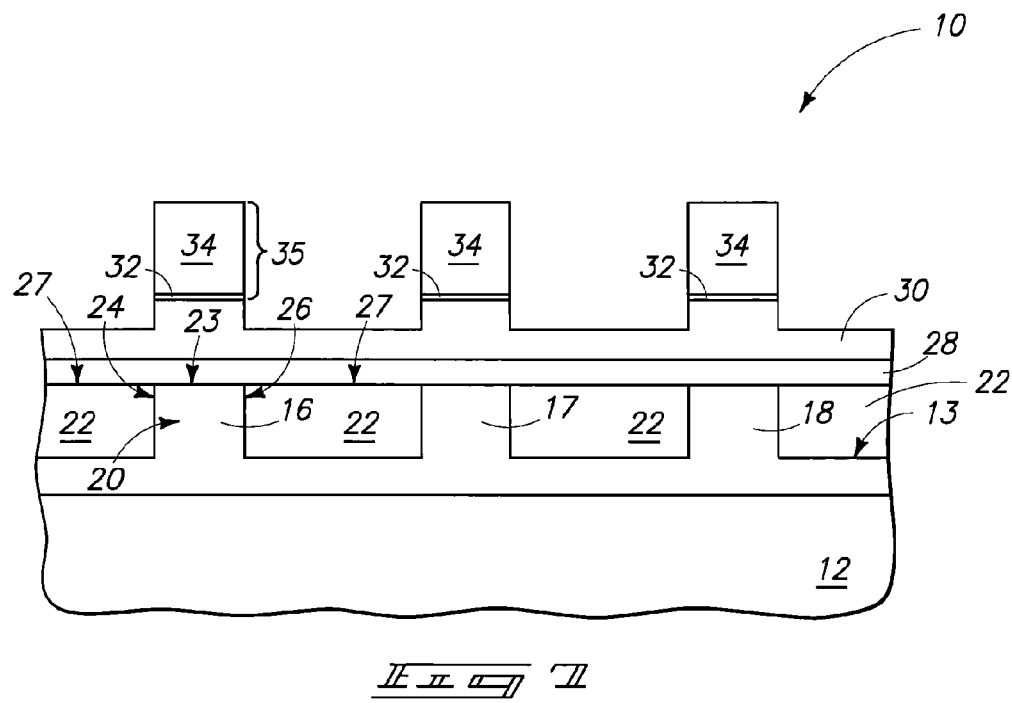
FIG. 7 is a view of the FIG. 6 substrate fragment at a processing step subsequent to that shown by FIG. 6.

Referring to FIG. 7, a first etching has been conducted only partially into conductive material 30 in the depicted planar cross section using etch mask 35 as a mask. Such is referred to for convenience as a "first etching" in differing from a "second etching" described below. Regardless, any use of "first" and "second" herein with respect to methodical aspects defines temporal relationship between the two, and not necessarily being the first act of etching carried out on the stated material or the second act of etching carried out on the stated material being etched.

Figure 8:
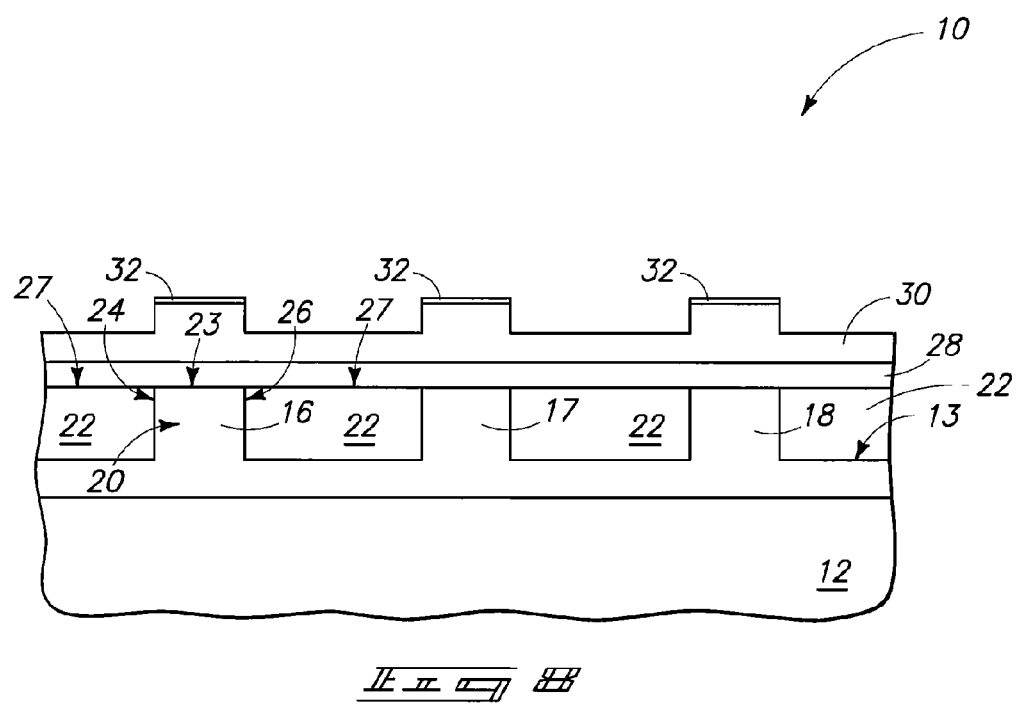
FIG. 8 is a view of the FIG. 7 substrate fragment at a processing step subsequent to that shown by FIG. 7.

Referring to FIG. 8, at least an elevationally outermost portion of etch mask 35 has been removed in the one planar cross section after the partial first etching into conductive material 30. In one embodiment and as shown, such removing is of only an elevationally outermost portion of etch mask 35. In one embodiment, the removed portion is at least 75% of thickness of etch mask 35 in the one planar cross section of FIG. 7. In one embodiment and as shown, removing of an elevationally outermost portion of the etch mask has been conducted by removing second material 34 (not shown) selectively relative to first material 32 to leave first material 32 over conductive material 30. In the context of this document, a "selective" removal or etching action requires removal of the one material at a rate of at least 2:1 relative to the other stated material. In the above example embodiment where second material 34 comprises photoresist and first material 32 comprises any of silicon nitride, silicon carbide, or amorphous carbon, second material 34 can be removed selectively relative to first material 32 by etching action using suitable wet solvent processing, or alternately by $O_2$ ashing.

Figure 9:
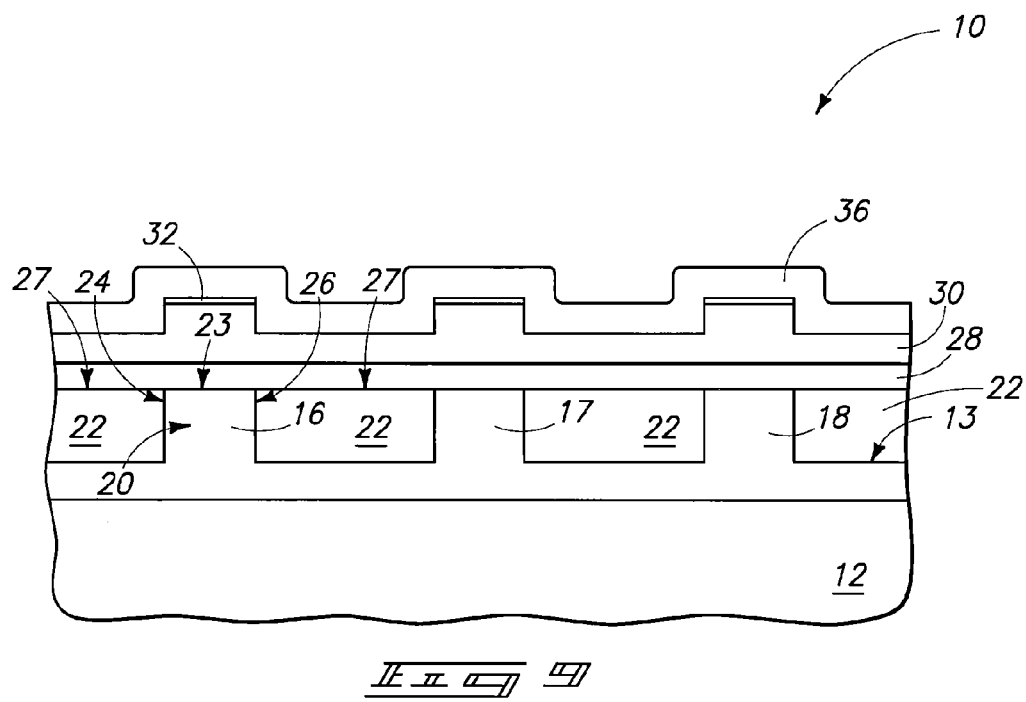
FIG. 9 is a view of the FIG. 8 substrate fragment at a processing step subsequent to that shown by FIG. 8.

Referring to FIG. 9, a layer 36 has been deposited over conductive material 30 and over first material 32. Such may be the same or different in composition from that of first material 32.

Figure 10:
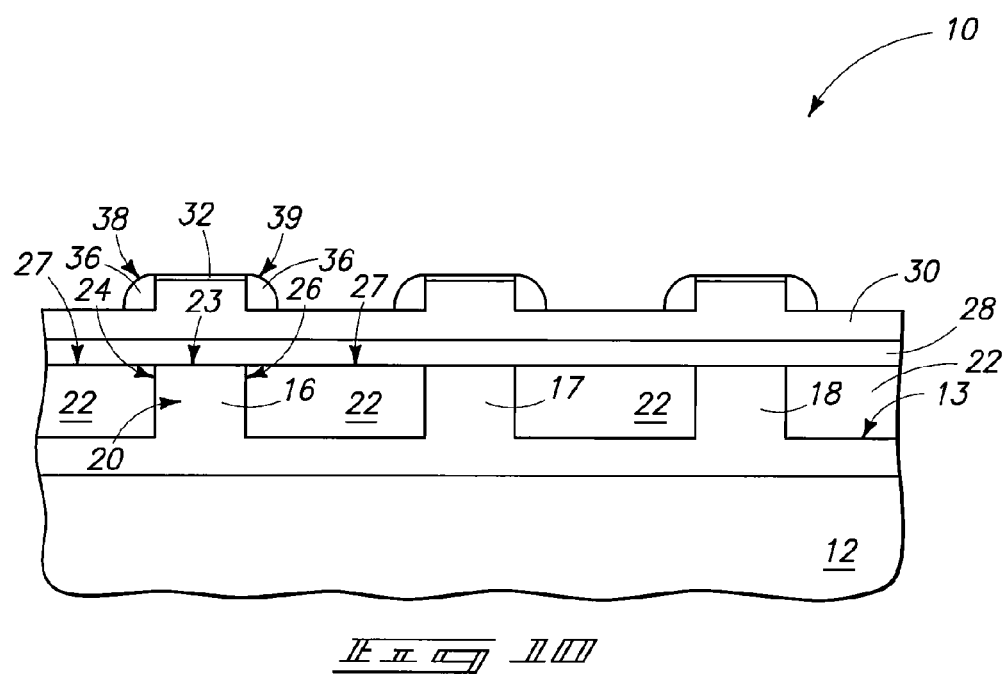
FIG. 10 is a view of the FIG. 9 substrate fragment at a processing step subsequent to that shown by FIG. 9.

Referring to FIG. 10, layer 36 has been etched through to expose conductive material 30 and leaves laterally spaced masks 38, 39 of layer 36 over conductive material 30 in the planar cross section depicted by FIG. 10 across first electrode 20. In one embodiment and as shown, such leaves at least some of first material 32 over conductive material 30 between laterally spaced masks 38, 39. In one embodiment, such etching through layer 36 is conducted without using any patterned photoresist-comprising etch mask over layer 36 in the planar cross section depicted by FIG. 10 across first electrode 20, and in one embodiment without using any patterned photoresist-comprising etch mask over layer 36 anywhere on the substrate during such etching. Regardless, such etching may or may not be conducted selectively relative to conductive material 30.

Figure 11:
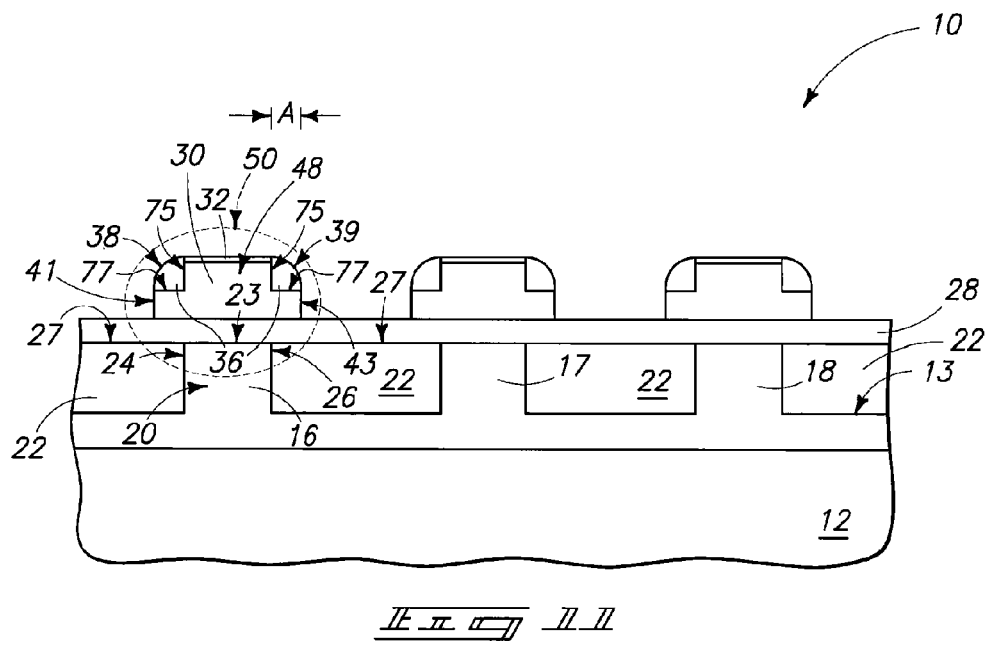
FIG. 11 is a view of the FIG. 10 substrate fragment at a processing step subsequent to that shown by FIG. 10.

Referring to FIG. 11, second etching has been conducted through conductive material 30 using laterally spaced masks 38, 39 as masking. In the example embodiment, such second etching is also conducted using the remnant first material 32 as masking, with such second etching of conductive material 30 being conducted selectively relative to first material 32. Alternately by way of example only, first material 32 might be etched completely through, or material 32 not used at all as masking, whereby at least some of conductive material 30 between laterally spaced masks 38, 39 would also be etched. Regardless in the depicted embodiment, such second etching has been conducted to multi-resistive state metal oxide-comprising material 28. In one embodiment, such comprises plasma etching, and whereby multi-resistive state metal oxide-comprising material 28 is exposed to plasma etching upon completing plasma etching through conductive material 30. Regardless, the second etching is depicted as forming opposing laterally outermost conductive edges 41, 43 of conductive material 30 in the planar cross section depicted by FIG. 11 (e.g., as taken through first conductive electrode 20) at the conclusion of such second etching, and which are received laterally outward of opposing laterally outermost edges 24, 26 of first conductive electrode 20 in such planar cross section. In one embodiment, opposing laterally outermost edges 41, 43 of conductive material 30 in the planar cross section are laterally outward of opposing laterally outermost edges 24, 26 of the elevationally outermost surface of first conductive electrode 20 by a dimension "A" of at least 50 Angstroms.

In one embodiment, the second etching of conductive material 30 is conducted without using any patterned photoresist-comprising etch mask over conductive material 30 in the one planar cross section, and in one embodiment without using any patterned photoresist-comprising etch mask anywhere on the substrate.

Figure 12:
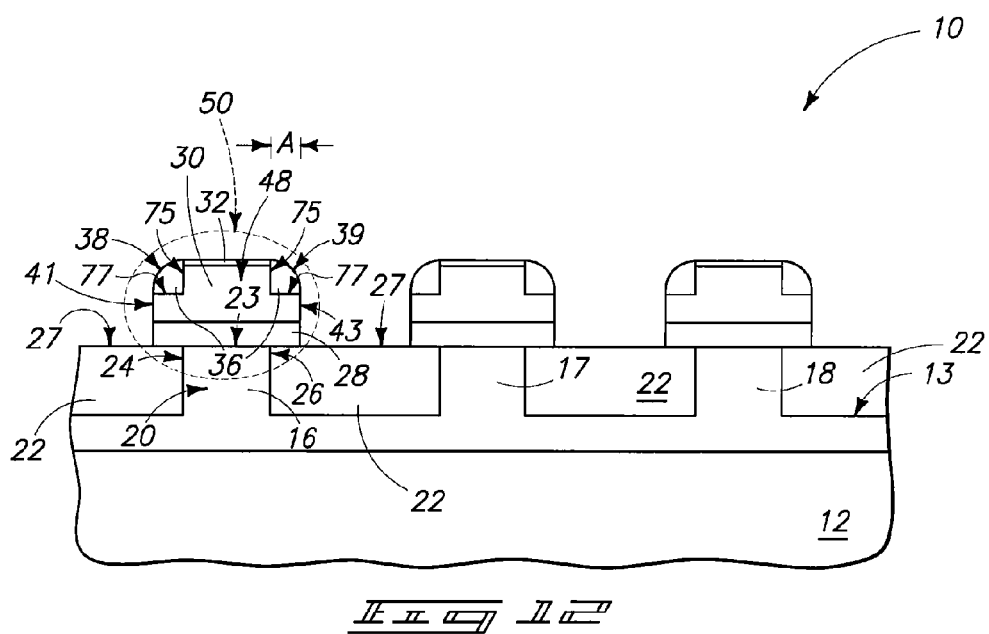
FIG. 12 is a view of the FIG. 11 substrate fragment at a processing step subsequent to that shown by FIG. 11.

By way of example only, FIG. 11 depicts a non-volatile resistive oxide memory cell 50 comprising first conductive electrode 20, a second conductive electrode 48 comprising conductive material 30, and multi-resistive state metal oxide-comprising material 28 received therebetween. In one embodiment, the second conductive electrode has opposing laterally outermost edges 41, 43 which are received over insulative material 22. Regardless, multi-resistive state metal oxide-comprising material 28 may or may not be etched through between adjacent non-volatile resistive oxide memory cells. For example, FIG. 12 depicts subsequent processing whereby such etching has been conducted, although embodiments of the invention also encompass no such etching through or into multi-resistive state metal oxide-comprising material 28. Further, if such etching is conducted, laterally spaced masks 38, 39, and/or first material 32, may or may not be used as an etching mask during such etching of material 28. Further and regardless, laterally spaced masks 38, 39 may or may not partially or wholly form a part of the finished circuitry construction. FIGS. 13 and 14 by way of example only depict removal of laterally spaced masks 38, 39 and first layer 32 from the substrate. Subsequently deposited insulative and wiring layers (not shown) would likely be provided over the substrate of FIGS. 13 and 14 in a finished circuitry construction.

Figure 15:
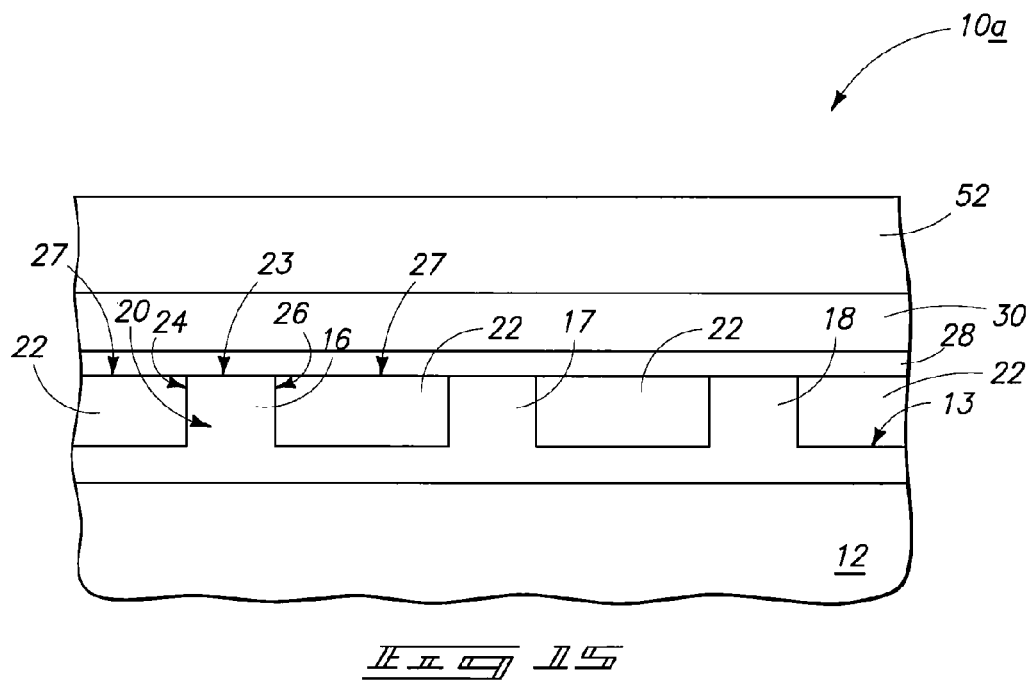
FIG. 15 is view of an alternate embodiment substrate fragment, and depicts an alternate processing of the substrate of FIG. 5 as would follow after the processing of the FIG. 4 substrate fragment.

Alternate exemplary methods and construction are next described with reference to FIGS. 15-18 with respect to a substrate fragment 10a. Like numerals from the first described embodiment are utilized where appropriate, with differences being indicated with the suffix "a" or with different numerals. FIG. 15 depicts processing alternate to that shown by FIG. 5 in the formation of a masking layer 52. Such might comprise photoresist, including multi layer resist and/or other masking layers and material.

Figure 16:
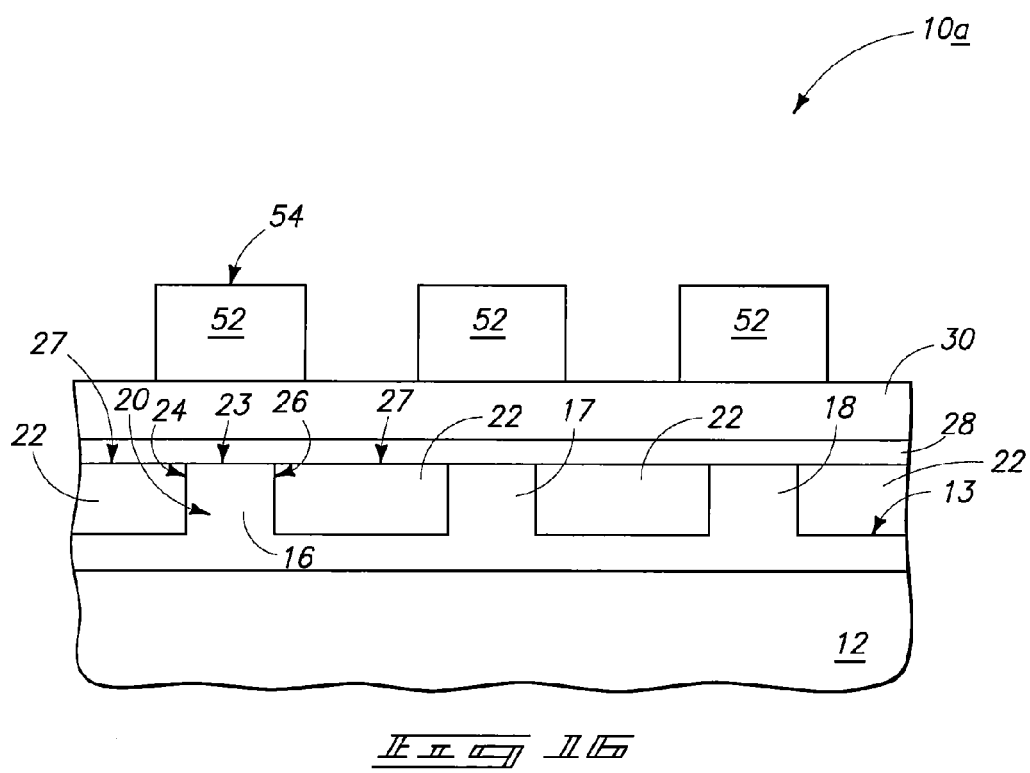
FIG. 16 is a view of the FIG. 15 substrate fragment at a processing step subsequent to that shown by FIG. 15.

Referring to FIG. 16, masking layer 52 has been lithographically patterned to form a mask 54 over conductive material 30 in the example one planar cross section through first electrode 20. Where layer 52 comprises one or more photoimageable materials, such might inherently be utilized for such lithographic patterning. Alternately by way of example only, a lithographically patterned mask (not shown) might be provided outwardly of layer 52, and thereafter patterned to transfer a pattern to layer 52.

Referring to FIG. 17, etching has been conducted through conductive material 30 using mask 54 to form opposing laterally outermost conductive edges 41a and 43a of conductive material 30 at the conclusion of such etching which are received laterally outward of opposing laterally outermost edges 24, 26 of first conductive electrode 20 in the depicted planar cross section. In one example embodiment, mask 54 comprises photoresist during such etching through conductive material 30. Regardless, material 30 comprises a second conductive electrode 48a of the memory cell being fabricated.

Referring to FIG. 18, at least an outermost portion of lithographically patterned mask 54 (not shown) is etched from the substrate after etching through conductive material 30. In the depicted FIG. 18 example, the etching of the lithographically patterned mask removes all of such mask from the substrate. Processing can otherwise and/or additionally occur as described above with respect to the FIGS. 1-14 embodiments.

Any of the above described embodiment methods constitute, by way of examples only, manners of forming a non-volatile resistive oxide memory cell which encompasses forming a first conductive electrode of the memory cell as part of a substrate. Multi-resistive state metal oxide-comprising material is formed over the first conductive electrode. Conductive material is deposited over the multi-resistive state metal oxide-comprising material. A second conductive electrode of the memory cell which comprises the conductive material is formed over the multi-resistive state metal oxide-comprising material.

In any of the above embodiments, the forming of the second conductive electrode comprises etching through the conductive material to form opposing laterally outermost conductive edges of such conductive material in one planar cross section, at the conclusion of such etching, which are received laterally outward of the opposing laterally outermost edges of the first conductive electrode in the one planar cross section. In some of the above embodiments, the etching through the conductive material comprises some last period of time within which such etching is completed through the conductive material, wherein such etching during the last period is conducted without using any patterned photoresist-comprising etch mask over the conductive material in the one planar cross section, and in some embodiments without using any patterned photoresist-comprising etch mask anywhere on the substrate. Yet in some embodiments, the etching during the last period is conducted using a patterned photoresist-comprising etch mask over the conductive material in the one planar cross section.

Figure 19:
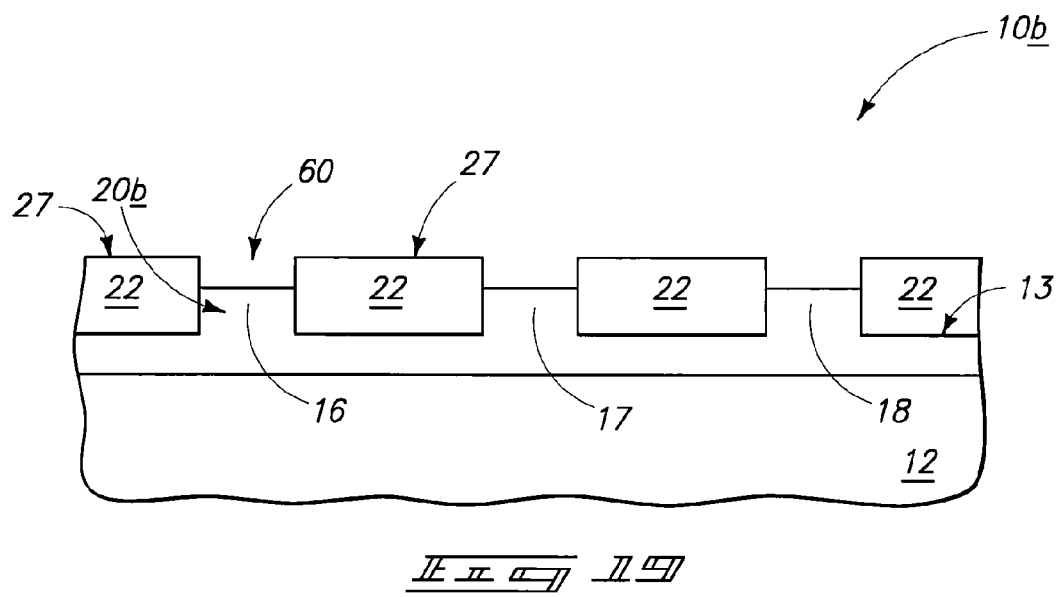
FIG. 19 is view of an alternate embodiment substrate fragment, and depicts an alternate processing of the substrate of FIG. 3 as would follow after the processing of the FIG. 2 substrate fragment.

Additional and/or alternate embodiments are next described with reference to FIGS. 19-24. Referring initially to FIG. 19, a substrate fragment is indicated generally with reference numeral 10b. Like numerals from the first described embodiment are utilized where appropriate, with differences being indicated with the suffix "b" or with different numerals. FIG. 19 depicts alternate example processing of the substrate of FIG. 2 prior to that of FIG. 3. Specifically, FIG. 19 depicts etching of conductive first electrode material 16 selectively relative to insulative material 22 to provide an opening 60 in insulative material 22 in the depicted planar cross section of the example memory cell being fabricated over conductive first electrode material of first electrode 20b. Such can be conducted by any suitable selective etching chemistry depending upon the compositions of materials 16 and 22, as will be appreciated by the artisan.

Figure 20:
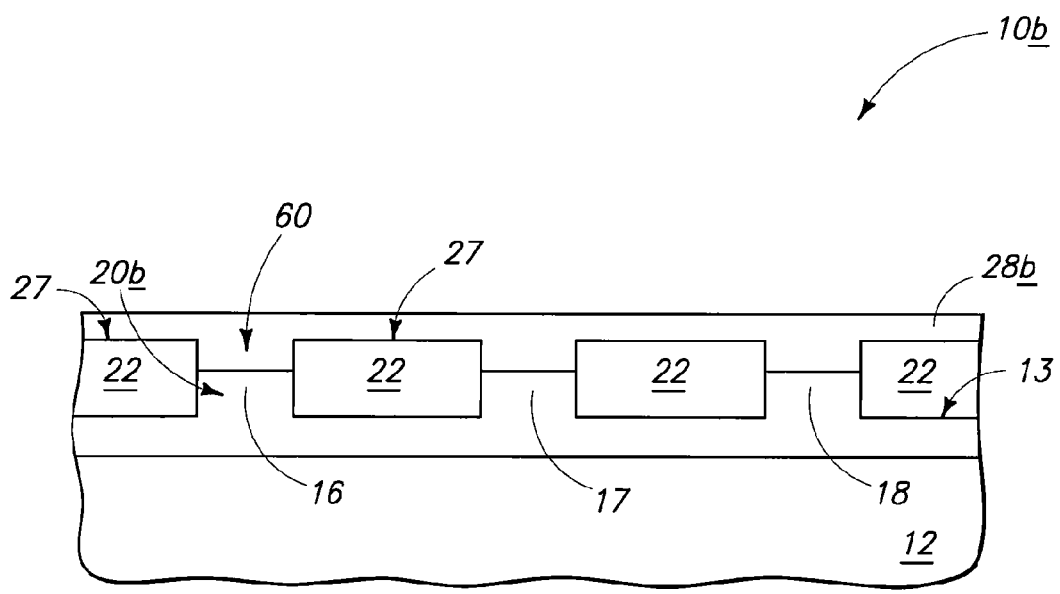
FIG. 20 is a view of the FIG. 19 substrate fragment at a processing step subsequent to that shown by FIG. 19.

Referring to FIG. 20, multi-resistive state metal oxide-comprising material 28b has been formed within opening 60 over first conductive electrode 20a. In one embodiment, multi-resistive state metal oxide-comprising material 28b fills opening 60 over first conductive electrode 20b, and is also received over insulative material 22. Multi-resistive state metal oxide-comprising material 28b may or may not be provided with an outermost planar surface.

Some embodiments of the invention encompass methods of forming a non-volatile resistive oxide memory cell which comprise forming a first conductive electrode of the memory cell as part of a substrate, and with the first conductive electrode material being received within insulative material. In one embodiment, such insulative material can be considered as comprising an elevationally outer surface, and which may or may not be planar. In one embodiment, an opening is received in the insulative material through the elevationally outer surface in one planar cross section over the first conductive electrode. FIG. 19, by way of example only, depicts such an embodiment.

In one embodiment, multi-resistive state metal oxide-comprising material is formed within the opening over the first conductive electrode, and in one embodiment is formed to fill such opening. Regardless in such embodiments, a second conductive electrode of the memory cell is formed over the multi-resistive state metal oxide-comprising material, and independent and regardless of the respective positioning of the opposing laterally outermost edges of the first and second conductive electrodes relative one another. Such are shown by way of examples only in FIGS. 21-24 with respect to different alternate embodiments 10b, 10c, 10d, and 10e, respectively. Like numerals from the other described embodiments are utilized where appropriate, with differences being indicated with the respective letter suffixes or with different numerals.

Figure 21:
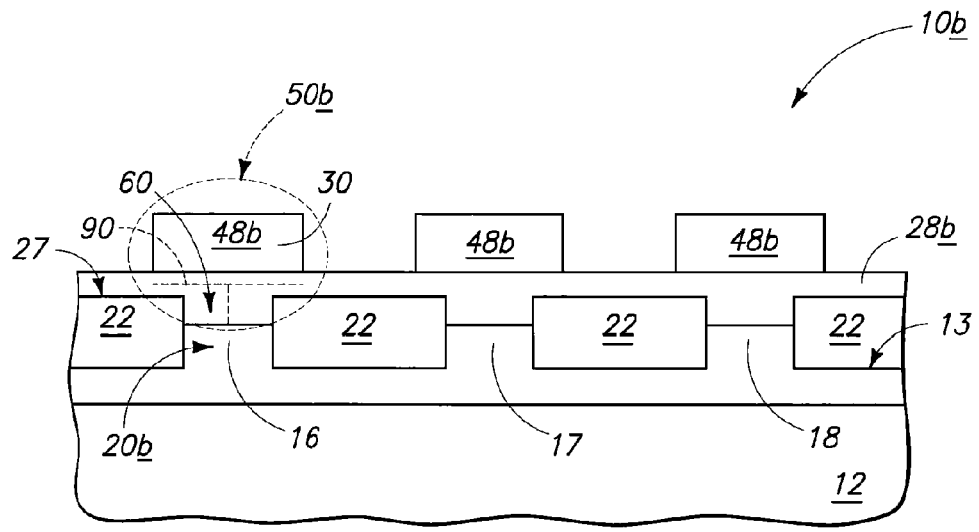
FIG. 21 is a view of the FIG. 20 substrate fragment at a processing step subsequent to that shown by FIG. 20.

For example, FIG. 21 depicts a substrate fragment 10b comprising a second conductive electrode 48b which has been patterned in the same manner and shape as that of second electrode 48a in FIGS. 17 and 18.

Figure 22:
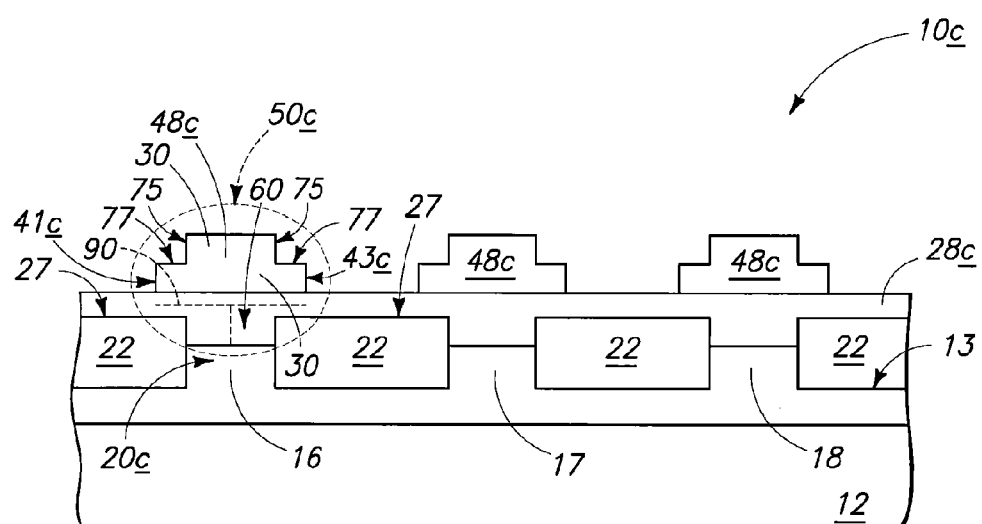
FIG. 22 is view of an alternate embodiment substrate fragment, and depicts an alternate processing of the substrate of FIG. 21 as would follow after the processing of the FIG. 20 substrate fragment.

FIG. 22 illustrates an alternate example wherein a second conductive electrode 48c has been fabricated in the same manner to produce the same essential shape of second electrode 48 in FIG. 13.

Figure 23:
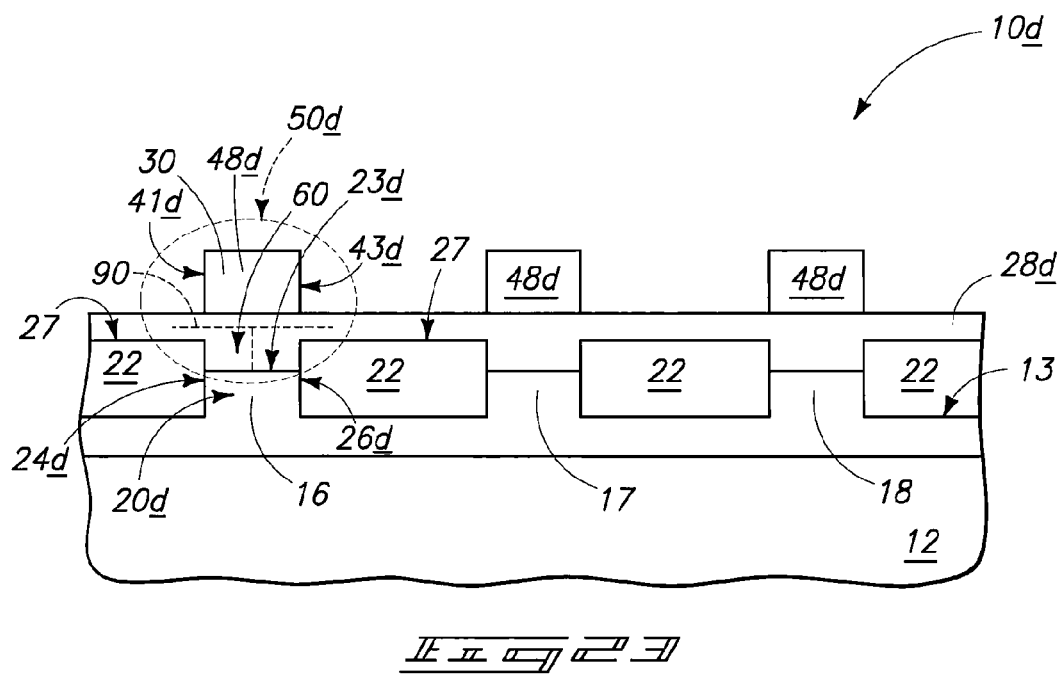
FIG. 23 is view of an alternate embodiment substrate fragment, and depicts an alternate processing of the substrate of FIG. 21 as would follow after the processing of the FIG. 20 substrate fragment.

However, FIG. 23 illustrates yet another alternate example second conductive electrode 48d comprising a different shape or configuration from any of that of the above depicted second conductive electrode 48, 48a, 48b, or 48c. Specifically, FIG. 23 depicts an example embodiment wherein opposing laterally outermost conductive edges 41d, 43d of conductive material 30 of a second conductive electrode 48e in the depicted planar cross section are not received laterally outward of opposing laterally outermost edges 24d, 26d at the elevationally outermost surface 23d of first conductive electrode 20d in the depicted planar cross section.

Figure 24:
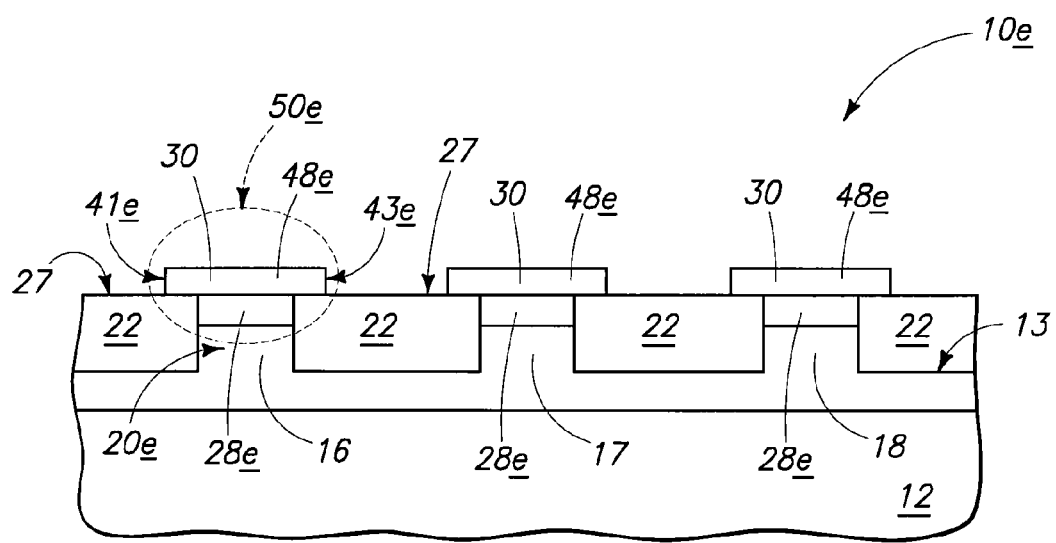
FIG. 24 is view of an alternate embodiment substrate fragment, and depicts an alternate processing of the substrate of FIG. 20 as would follow after the processing of the FIG. 19 substrate fragment.

FIG. 24 illustrates, by way of example only, yet another embodiment substrate 10e comprising a non-volatile resistive oxide memory cell 50e wherein multi-resistive state metal oxide-comprising material 28e is not received over outermost surfaces 27 of insulative material 22. Further of course and by way of example only, any of the depicted example second conductive electrode constructions of FIGS. 21, 22 and 23, or otherwise, and whether existing or yet-to-be developed, might additionally or alternately be used.

Regardless, embodiments of the invention contemplate non-volatile resistive oxide memory cells independent of method of fabrication. In one example embodiment, a non-volatile resistive oxide memory cell comprises a first conductive electrode which comprises an elevationally outermost surface and opposing laterally outermost edges at the elevationally outermost surface in one planar cross section. In one embodiment, a first conductive line runs in one direction within the one planar cross section, for example the conductive line 13 in the above described embodiments. In one embodiment, the first conductive electrode comprises a conductive projection extending upwardly from the first conductive line, for example as in any of the embodiments as shown and described above.

Multi-resistive state metal oxide-comprising material is received over the first conductive electrode. A second conductive electrode is received over the multi-resistive state metal oxide-comprising material. The second conductive electrode comprises opposing laterally outermost conductive edges in the one planar cross section which are received laterally outward of the opposing laterally outermost edges of the first conductive electrode in the one planar cross section. By ways of example only, any of the above non-volatile resistive oxide memory cells 50, 50a, 50b, 50c and 50e constitute exemplary such memory cells.

In some embodiments, the second conductive electrode comprises a portion of a second conductive line running orthogonal to the one direction and one planar cross section. For example, FIG. 14 depicts such an example second conductive line a portion of which comprises second conductive electrode 48.

Regardless, in some embodiments, the second conductive electrode comprises opposing laterally innermost edges, for example edges 75 depicted with respect to second conductive electrode 48 in connection with non-volatile resistive oxide memory cell 50 in FIGS. 11-14, and memory cell 50c in FIG. 22. In one embodiment, the opposing laterally outermost edges and the opposing laterally innermost edges extend in respective straight lines in the one planar cross section and are parallel one another. In one embodiment, the straight lines are vertically oriented, again for example as depicted in FIGS. 11-14, and in FIG. 22.

Regardless, in one embodiment, the non-volatile resistive oxide memory cell comprises a conductive horizontal surface received between the opposing laterally outermost edges and the opposing laterally innermost edges, for example the depicted horizontal surfaces 77 as shown in FIGS. 11-14, and in FIG. 22.

In one embodiment, a non-volatile resistive oxide memory cell comprises a first conductive electrode and second conductive electrode. Multi-resistive state metal oxide-comprising material is received between the first and second conductive electrodes. The multi-resistive state metal oxide-comprising material is T-shaped in one planar cross section which includes the first conductive electrode, the second conductive electrode and the multi-resistive state metal oxide-comprising material. For example, the FIGS. 21-23 memory cells 50b, 50c and 50d comprise respective "T-s" 90 in the respective planes upon which FIGS. 21-23 lie.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a non-volatile resistive oxide memory cell, comprising:
   forming a first conductive electrode of the memory cell as part of a substrate, the first conductive electrode being within insulative material which comprises an elevationally outer surface, an opening being in the insulative material through the elevationally outer surface in one planar cross section over the first conductive electrode, the opening extending upwardly to the elevationally outermost surface of the insulative material in the one planar cross section;
   forming programmable multi-resistive state metal oxide-comprising material within the opening over the first conductive electrode, the opening having a total volume that is completely filled by and with the programmable multi-resistive state metal oxide-comprising material; and
   forming a second conductive electrode of the memory cell over the programmable multi-resistive state metal oxide-comprising material.

2. The method of claim 1 wherein the elevationally outer surface is planar.

3. The method of claim 1 wherein forming the first conductive electrode comprises:
   providing conductive first electrode material within the insulative material; and
   etching the conductive first electrode material selectively relative to the insulative material to elevationally recess the conductive first electrode material relative to the insulative material thereby forming the opening which is subsequently completely filled with said programmable multi-resistive state metal oxide-comprising material.

4. The method of claim 1 comprising forming the programmable multi-resistive state metal oxide-comprising material over the elevationally outer surface of the insulative material.

5. The method of claim 1 comprising forming the second conductive electrode to comprise a conductive line, the conductive line having opposing laterally outermost edges which are over the insulative material, the programmable multi-resistive state metal oxide-comprising material extending laterally beyond each of the opposing laterally-outermost edges of the conductive line.

6. The method of claim 1 wherein the forming of the first conductive electrode comprises selective etching of conductive material of the first conductive electrode.

7. The method of claim 6 wherein the selective etching is relative to the insulative material.

8. A method of forming a non-volatile resistive oxide memory cell, comprising:
   forming a conductive first electrode material as part of a substrate, the conductive first electrode material being within insulative material;
   etching the conductive first electrode material selectively relative to the insulative material to elevationally recess the conductive first electrode material relative to the insulative material and thereby form an opening in the insulative material in one planar cross section over the conductive first electrode material, the conductive first electrode material comprising a first conductive electrode of the memory cell, the opening extending upwardly to the elevationally outermost surface of the insulative material in the one planar cross section;
   forming programmable multi-resistive state metal oxide-comprising material within the opening over the first conductive electrode, the opening having a total volume that is completely filled by and with the programmable multi-resistive state metal oxide-comprising material; and
   forming a second conductive electrode of the memory cell over the programmable multi-resistive state metal oxide-comprising material.

9. The method of claim 8 comprising forming the programmable multi-resistive state metal oxide-comprising material over the elevationally outer surface of the insulative material.

10. The method of claim 8 comprising forming the second conductive electrode to comprise a conductive line, the conductive line having opposing laterally outermost edges which are over the insulative material, the programmable multi-resistive state metal oxide-comprising material extending laterally beyond each of the opposing laterally-outermost edges of the conductive line.

11. The method of claim 8 wherein the programmable multi-resistive state metal oxide-comprising material is formed to completely fill the opening over the first conductive electrode by and with the programmable multi-resistive state metal oxide-comprising material.

12. The method of claim 8 wherein the insulative material has an elevationally outer surface that is planar.

13. A method of forming a non-volatile resistive oxide memory cell, comprising:
   forming a first conductive electrode of the memory cell as part of a substrate, the first conductive electrode being within insulative material which comprises an elevationally outer surface, an opening being in the insulative material through the elevationally outer surface in one planar cross section over the first conductive electrode;
   forming programmable multi-resistive state metal oxide-comprising material within the opening over the first conductive electrode, the opening being completely filled by and with the programmable multi-resistive state metal oxide-comprising material; and
   forming a second conductive electrode of the memory cell over the programmable multi-resistive state metal oxide-comprising material, and comprising forming the second conductive electrode to comprise a conductive line, the conductive line having opposing laterally outermost edges which are over the insulative material, the programmable multi-resistive state metal oxide-comprising material extending laterally beyond each of the opposing laterally-outermost edges of the conductive line.

14. A method of forming a non-volatile resistive oxide memory cell, comprising:
   forming a conductive first electrode material as part of a substrate, the conductive first electrode material being within insulative material;
   etching the conductive first electrode material selectively relative to the insulative material to elevationally recess the conductive first electrode material relative to the insulative material and thereby form an opening in the insulative material in one planar cross section over the conductive first electrode material, the conductive first electrode material comprising a first conductive electrode of the memory cell;
   forming programmable multi-resistive state metal oxide-comprising material within the opening over the first conductive electrode, the opening being completely filled by and with the programmable multi-resistive state metal oxide-comprising material; and
   forming a second conductive electrode of the memory cell over the programmable multi-resistive state metal oxide-comprising material, and comprising forming the second conductive electrode to comprise a conductive line, the conductive line having opposing laterally outermost edges which are over the insulative material, the programmable multi-resistive state metal oxide-comprising material extending laterally beyond each of the opposing laterally-outermost edges of the conductive line.

* * * * *